US006949326B2

(12) United States Patent
Mitsumoto et al.

(10) Patent No.: US 6,949,326 B2
(45) Date of Patent: Sep. 27, 2005

(54) LITHOGRAPHIC PRINTING PLATE FOR INFRARED LASER

(75) Inventors: Tomoyoshi Mitsumoto, Shizuoka (JP); Noriaki Watanabe, Shizuoka (JP); Kazuo Maemoto, Shizuoka (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 213 days.

(21) Appl. No.: 10/217,486

(22) Filed: Aug. 14, 2002

(65) Prior Publication Data

US 2003/0118942 A1 Jun. 26, 2003

(30) Foreign Application Priority Data

Aug. 30, 2001 (JP) ..................................... P.2001-261660

(51) Int. Cl.$^{7}$ ......................... B41C 1/055; G03F 7/004; G03F 7/038

(52) U.S. Cl. ..................... 430/273.1; 430/945; 430/944

(58) Field of Search ........................... 430/270.1, 271.1, 430/273.1, 944, 945

(56) References Cited

U.S. PATENT DOCUMENTS

2002/0086233 A1 * 7/2002 Kawauchi et al. ....... 430/270.1

* cited by examiner

*Primary Examiner*—Cynthia Hamilton
(74) *Attorney, Agent, or Firm*—Sughrue Mion, PLLC

(57) ABSTRACT

A lithographic printing plate for infrared laser is provided which shows an excellent coated surface state and an excellent stability with time against scratch, and which has a heat-sensitive layer containing the following (A) to (D):

(A) a substance which absorbs a light to generate heat;
(B) an alkaline aqueous solution-soluble resin having phenolic hydroxyl groups;
(C) a polymer containing as a polymerizable component (meth)acrylate monomer having within the molecule 2 or 3 perfluoroalkyl groups containing 3 to 20 carbon atoms; and
(D) a fluorine-containing polymer containing at lease a specific monomer as a copolymerizable component.

4 Claims, No Drawings

LITHOGRAPHIC PRINTING PLATE FOR INFRARED LASER

FIELD OF THE INVENTION

The present invention relates to an image-recording material to be used as an offset printing master and, more particularly, to a lithographic printing plate for so-called direct plate making adapted for infrared laser, which can be directly made into a printing plate using digital signals from a computer or the like.

BACKGROUND OF THE INVENTION

In recent years, laser technology has been markedly developed. In particular, small-sized solid laser devices or semiconductor laser devices emitting a light in the near-infrared to infrared range with a high output have become easily available. These laser devices are extremely useful as a light source for exposure in direct plate-making based on digital data from a computer or the like.

Lithographic printing plate materials adapted for infrared laser contain an alkaline aqueous solution-soluble binder resin and an IR dye capable of absorbing a light to generate heat as necessary components. In non-exposed areas (image areas), the IR dye functions as a dissolution inhibitor which substantially decreases solubility of the binder resin due to mutual action with the binder resin and, in the exposed areas (non-image areas), the mutual action between the IR dye and the binder resin is so weakened due to generated heat that the exposed areas are dissolved away with an alkaline developing solution to form a lithographic printing plate.

In order to realize a highly useful one as the above-described lithographic printing plate, there are two technical subjects of 1) attaining a high uniformity of the image-forming layer and 2) attaining a high hydrophobicity in image areas and a high removability of non-image areas by development.

Uniformity of image areas technically relates to mainly the above-described production steps, and original printing plates (i.e., printing plate precursors) having an insufficient uniformity show a seriously deteriorated degree of fundamental performance required for printing plates that many sheets of printed products with a high image quality be stably provided, thus not being preferred. Also, a high hydrophobicity of the image areas is important from the viewpoint that, by enhancing endurance against a developing solution in the plate-making steps, there are obtained an excellent resolving power and a sufficient durability or a sufficient ink-depositing properties in the printing steps. However, too high hydrophobicity of the image areas might possibly cause reduction in solubility of the image areas in an alkaline aqueous solution commonly used as a developing solution, leading to unfavorable results such as development failure of non-image areas and generation of a sludge component in the developing solution.

That is, to say in a simplified manner, hydrophobicity of image areas and removability of non-image areas require the image-forming layer to have conflicting properties, and development of technology capable of attaining the both properties at the same time has been a difficult and important subject to be solved.

With respect to the technical subject, it has been known that it is useful to use a composition containing a high molecular compound having fluoro aliphatic groups as an image-forming composition.

Specifically, there have been disclosed the effect of more improving the function of realizing uniformity of the film resulting from improvement of surface-activating ability; the effect of solving the problem of development delay due to hydrophobicity; and the effect of forming a contrasty image by attaining both hydrophobicity of image areas and removability of non-image areas utilizing hydrophobicity-orientating power.

For example, Japanese Patent (Application) Laid-Open No. 187318/2000 discloses an image-forming material excellent in solubility discrimination between image areas and non-image areas using a high molecular compound containing monomer units having two or more fluoro aliphatic groups.

Also, Japanese Patent (Application) Laid-Open No. 288093/1999 discloses that an image-forming material showing an improved stability before being developed and an excellent handlability can be obtained by using a specific fluorine-containing polymer.

As is described hereinbefore, an image-forming layer containing a fluoro aliphatic compound is effective as a technique for attaining the aforesaid technical subjects 1) and 2) which are commonly shared by image-forming layers for the original lithographic printing plate (i.e., the lithographic printing plate precursor). However, the effects are still insufficient, and more improvement is required. For example, state of the coated surface is still poor, and stability with time against scratch is insufficient.

SUMMARY OF THE INVENTION

An object of the present invention is to remove the defects with the above-described techniques and, more particularly, to provide a lithographic printing plate (adapted) for infrared laser, which shows a good coated surface state and an excellent stability with time against scratch.

As a result of intensive investigations, the inventors have found that the lithographic printing plate can be obtained by adding specific two kinds of fluorine-containing polymers in the heat-sensitive layer.

That is, the present invention is constituted by the following constitution.

(1) A lithographic printing plate (adapted) for infrared laser, which has a heat-sensitive layer containing the following (A) to (D):

(A) a substance which absorbs a light to generate heat;

(B) an alkaline aqueous solution-soluble resin having a phenolic hydroxyl group;

(C) a polymer containing as a polymerizable component a (meth)acrylate monomer having 2 or 3 perfluoroalkyl groups containing 3 to 20 carbon atoms within the molecule; and (D) a fluorine-containing polymer containing as copolymerizable components at least the following (1) to (3):

1) an addition polymerizable, fluorine-containing monomer having in the side chain a fluoro aliphatic group wherein hydrogen atoms on the carbon atoms are replaced by fluorine atoms;

2) a monomer of the following structure [1] to [4]; and 3) a monomer having an acidic hydrogen atom and having an acidic group wherein the acidic hydrogen atom is bound to a nitrogen atom:

$$CH_2{=}CA^1[CO{-}W{-}R^1] \quad [1]$$

$$CH_2{=}CA^1[O{-}CO{-}R^3] \quad [2]$$

$$CH_2{=}CA^1[U] \quad [3]$$

[4]

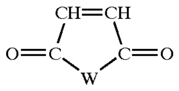

wherein $A^1$ represents a hydrogen atom, a halogen atom or an alkyl group, W represents oxygen or $—NR^1—$, $R^1$ represents a hydrogen atom, an alkyl group or an aryl group, $R^2$ represents an optionally substituted alkyl group or an optionally substituted aryl group, $R^3$ represents an alkyl group or an aryl group, and U represents a cyano group, an aryl group, an alkoxy group, an aryloxy group, an acyloxymethyl group, a nitrogen-containing hetero ring or $—CH2OCOR^3$ ($R^3$ being the same as defined above).

(2) The lithographic printing plate (adapted) for infrared laser as described in (1), wherein the polymer (C) is a copolymer between the polymerizable component described in (C) and a hydroxyl group-containing (meth) acrylate monomer.

(3) The lithographic printing plate (adapted) for infrared laser as described in (1) or (2), which further contains a copolymer containing, as a copolymerizable component, (E) at least one of the following 4) to 6) in a content of 10 mol % or more:

4) a monomer having within the molecule a sulfonamido group wherein at least one hydrogen atom is bound to the nitrogen atom;

5) a monomer having within the molecule an active imino group represented by the following formula:

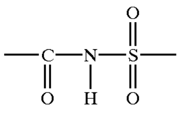

6) acrylamide, methacrylamide, acrylic ester, methacrylic ester or hydroxystyrene, each having a phenolic hydroxyl group.

(4) The lithographic printing plate (adapted) for infrared laser as described in one of claims 1 to 3, wherein the heat-sensitive layer is formed as a second heat-sensitive layer on a first heat-sensitive layer formed on a substrate which contains (A) a substance which absorbs a light to generate heat and (B) an alkaline aqueous solution-soluble resin.

DETAILED DESCRIPTION OF THE INVENTION

The lithographic printing plate of the present invention adapted for infrared laser (also referred to as "lithographic printing plate precursor for infrared laser") is described in more detail below.

The lithographic printing plate of the present invention for infrared laser has a heat-sensitive layer containing the following (A) to (D):

(A) a substance which absorbs a light to generate heat;

(B) an alkaline aqueous solution-soluble resin having a phenolic hydroxyl group;

(C) a polymer containing as a polymerizable component a (meth)acrylate monomer having 2 or 3 perfluoroalkyl groups containing 3 to 20 carbon atoms within the molecule; and (D) a fluorine-containing polymer containing as copolymerizable components at least the following (1) to (3):

1) an addition polymerizable, fluorine-containing monomer having in the side chain a fluoro aliphatic group wherein hydrogen atoms on the carbon atoms are replaced by fluorine atoms;

2) a monomer of the following structure [1] to [4]; and 3) a monomer having an acidic hydrogen atom and having an acidic group wherein the acidic hydrogen atom is bound to a nitrogen atom:

$CH_2{=}CA^1[CO—W—R^2]$ [1]

$CH_2{=}CA^1[O—CO—R^3]$ [2]

$CH_2{=}CA^1[U]$ [3]

[4]

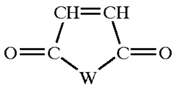

wherein $A^1$ represents a hydrogen atom, a halogen atom or an alkyl group, W represents oxygen or $—NR^1—$, $R^1$ represents a hydrogen atom, an alkyl group or an aryl group, $R^2$ represents an optionally substituted alkyl group or an optionally substituted aryl group, $R^3$ represents an alkyl group or an aryl group, and U represents a cyano group, an aryl group, an alkoxy group, an aryloxy group, an acyloxymethyl group, a nitrogen-containing hetero ring or $—CH_2OCOR^3$ ($R^3$ being the same as defined above).

Of these components, particularly important components (C) and (D) are first described below.

(C) A polymer containing as a polymerizable component a (meth)acrylate monomer having 2 or 3 perfluoroalkyl groups containing 3 to 20 carbon atoms within the molecule (hereinafter also referred to as polymer (C) or component (C)).

The polymer (C) contains as a polymerizable component a (meth)acrylate monomer having 2 or 3 perfluoroalkyl groups containing 3 to 20 carbon atoms within the molecule (hereinafter referred to as "fluorine-containing monomer"), and the fluorine-containing monomer is not particularly limited as long as 2 or 3 perfluoroalkyl groups containing 3 to 20 carbon atoms are bound to acryloyl or methacryloyl group through a 4-valent linking group.

In the present invention, those monomers which have only one perfluoroalkyl group or which have perfluoroalkyl groups containing less than 3 carbon atoms in some cases fail to improve discrimination of an image, whereas those monomers which have perfluoroalkyl groups containing more than 20 carbon atoms in some cases reduce sensitivity.

The polymer (C) preferably contains a fluorine-containing monomer represented by the following general formula (I) as a polymerizable component:

(I)

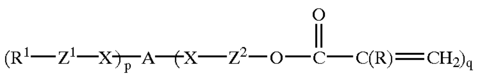

In the general formula (I), $R^1$ represents a perfluoroalkyl group containing 3 to 20 carbon atoms. In addition, $R^1$ may represent a perfluoroalkenyl group containing 3 to 20 carbon atoms.

These may be any of a straight form, a branched form, a cyclic form and a combination thereof and, further, may be those wherein the main chain is interrupted by an oxygen atom, such as $(CF_3)_2CFOCF_2CF_2—$.

$Z^1$ represents $—(CH_2)_n—$ (wherein n represents an integer of 1 to 6) or a group represented by the following formula (wherein R2 represents a hydrogen atom or an alkyl group containing 1 to 10 carbon atoms). Here, 2 or 3 $Z^1$'s contained in the general formula (I) may be 2 or 3 kinds of linking groups different from each other.

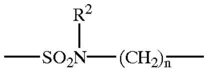

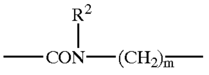

$Z^2$ represents $-(CH_2)_m-$ (wherein m represents an integer of 2 to 6) or a group represented by the following formula:

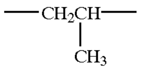

R represents a hydrogen atom, a methyl group or a halogen atom (Cl, Br, etc.). X represents a divalent linking group represented by the following formula (wherein Y represents a divalent linking group containing 15 or less carbon atoms and occupies 35 to65% by weight of the group X):

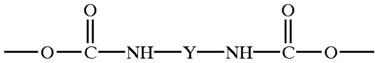

Typical examples of the divalent group represented by Y include the following:

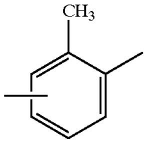
,
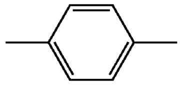
,
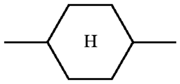
,
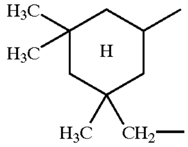
,
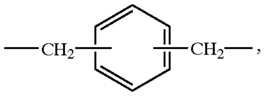
,
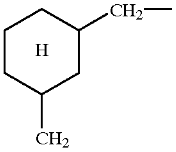

-continued

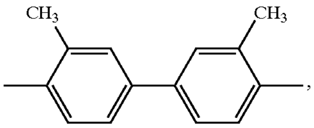
,
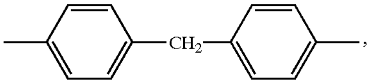
,
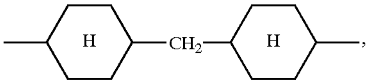
, $-(CH_2)_5-$,
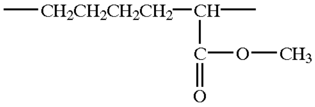

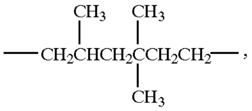
,
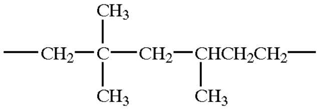

p represents 2 or 3, and q represents 1 or 2. A represents a trivalent or tetravalent linking group, and preferred examples thereof include the following:

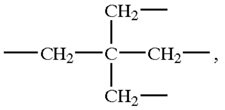
,
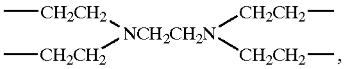
,
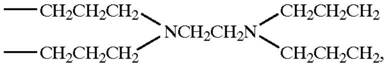
, or
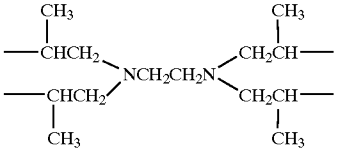

Specific examples of the fluorine-containing monomer are illustrated below which, however, do not limit the invention in any way.

A-1

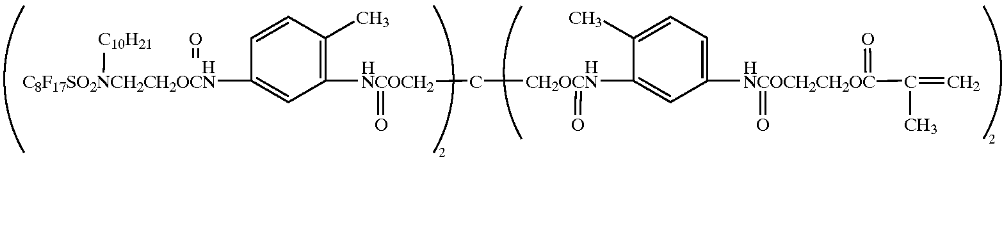

-continued
A-2
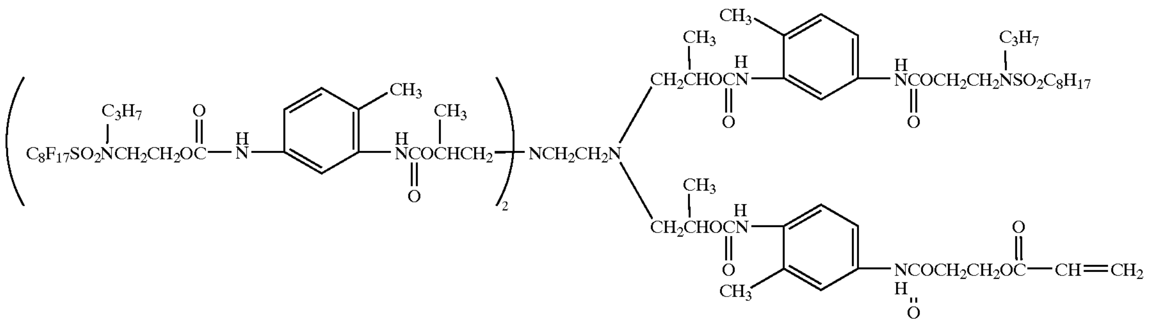
A-3
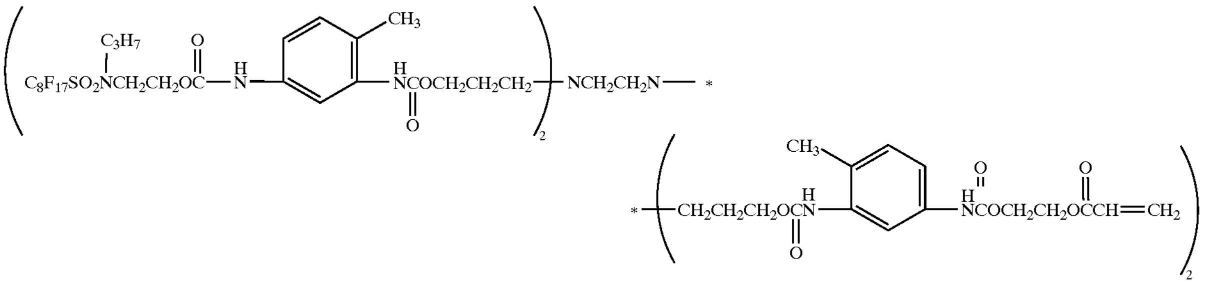
A-4
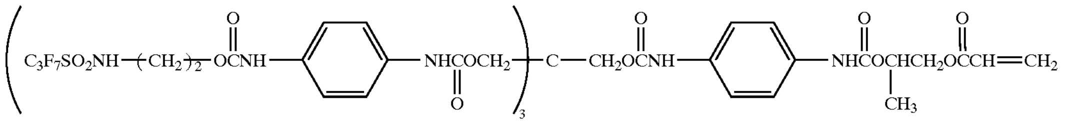
A-5
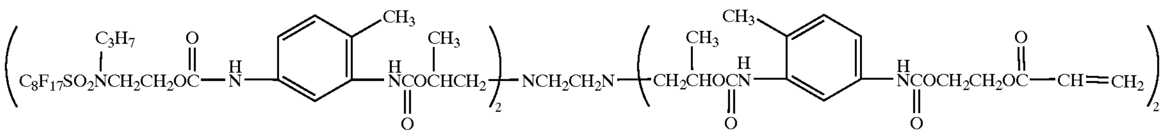
A-6
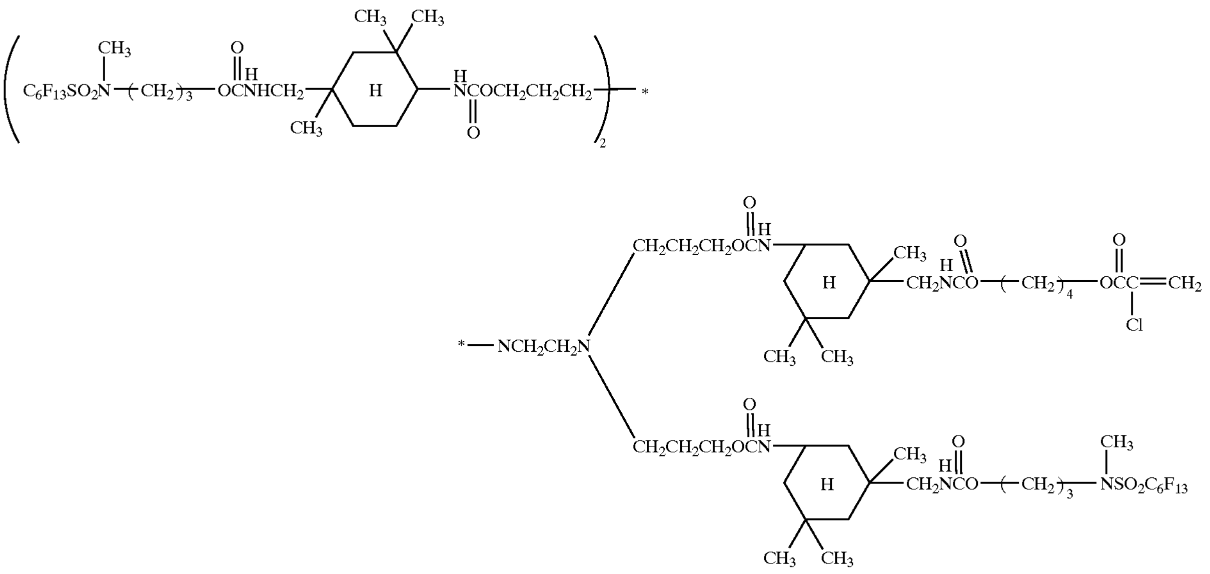

-continued
A-7
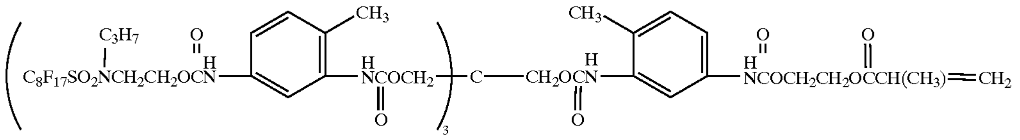
A-8
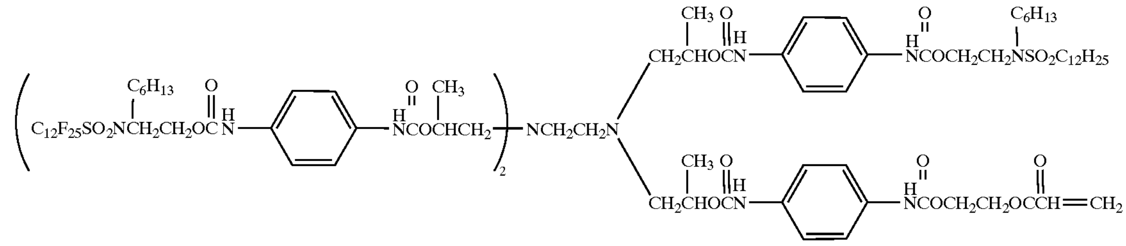
A-9
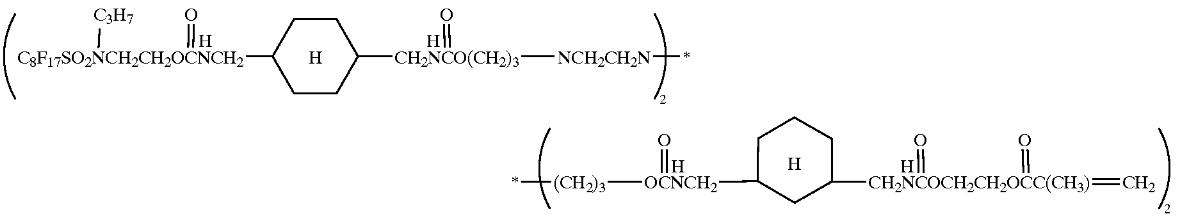
A-10
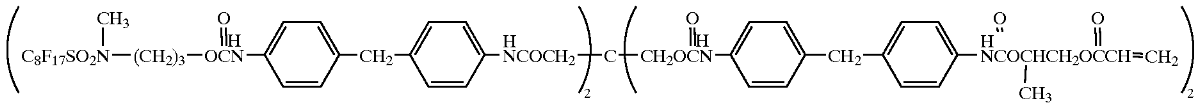
A-11
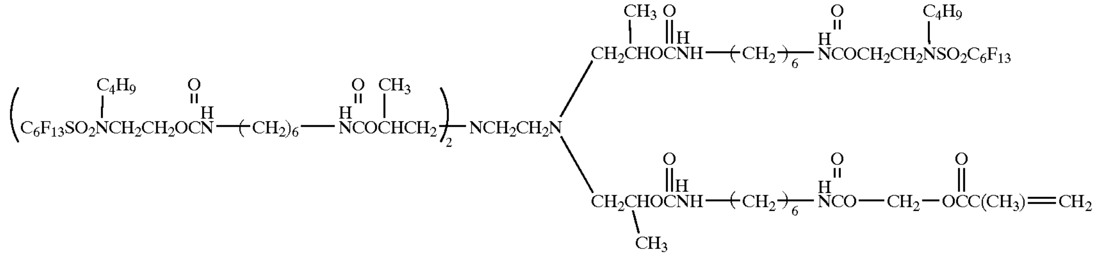
A-12
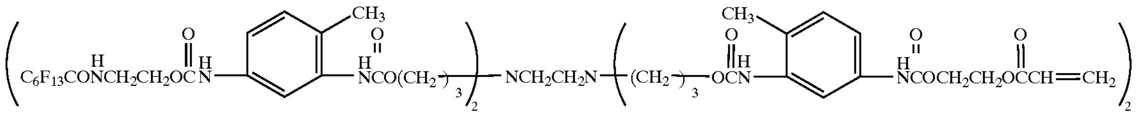
A-13
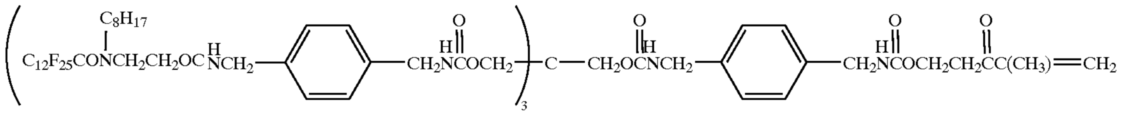

-continued
A-14
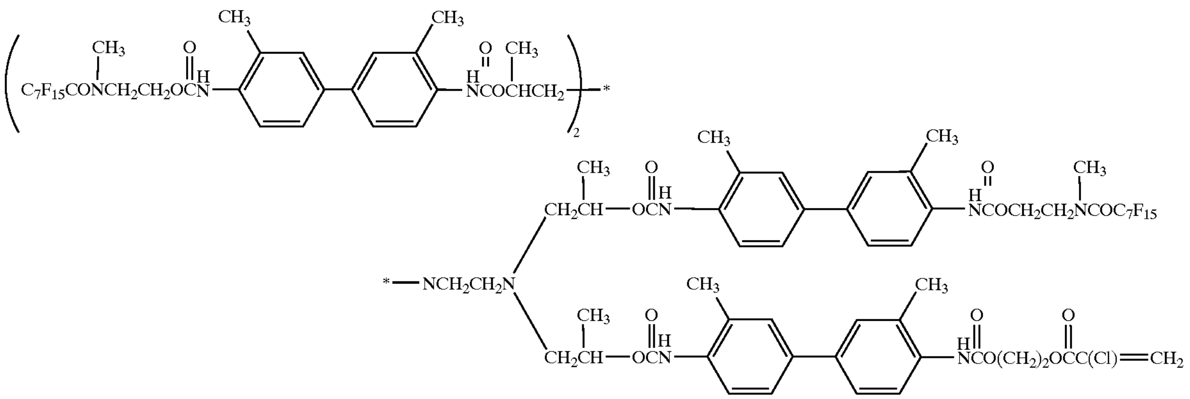
A-15
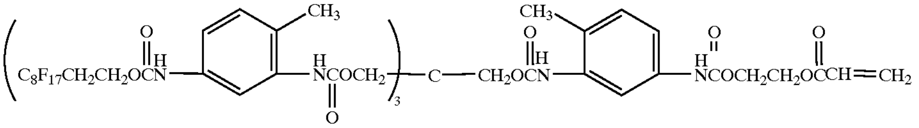
A-16
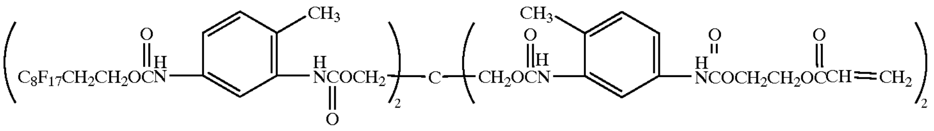
A-17
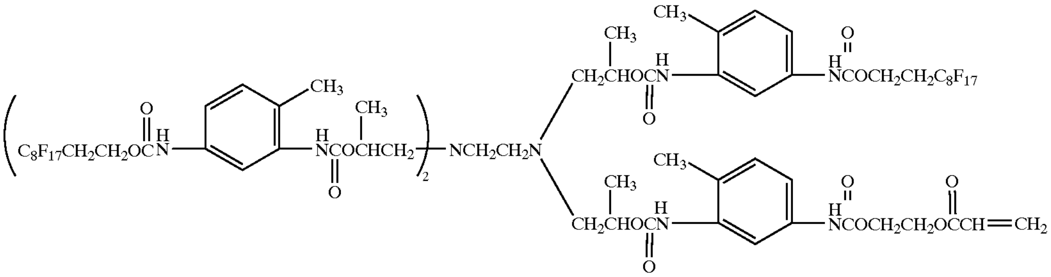
A-18
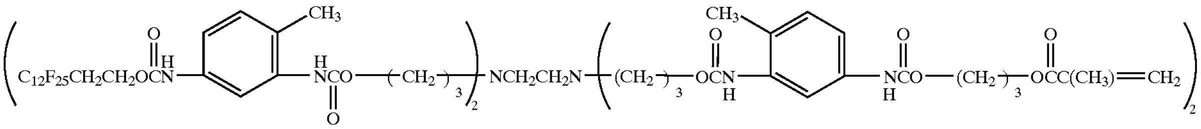
A-19
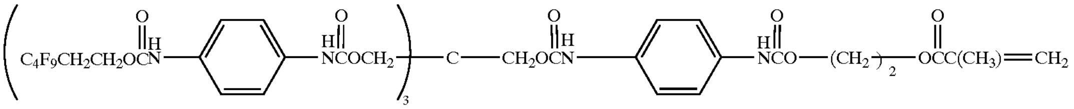
A-20
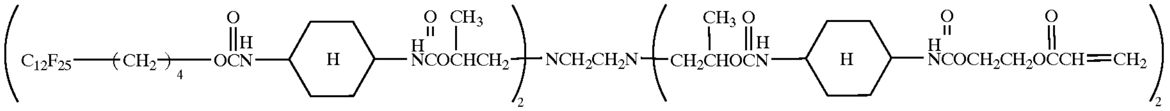
A-21
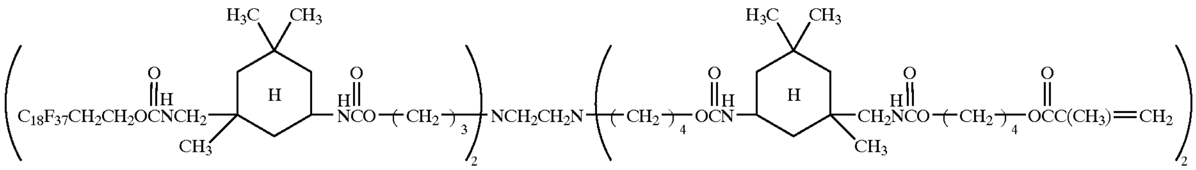

-continued
A-22
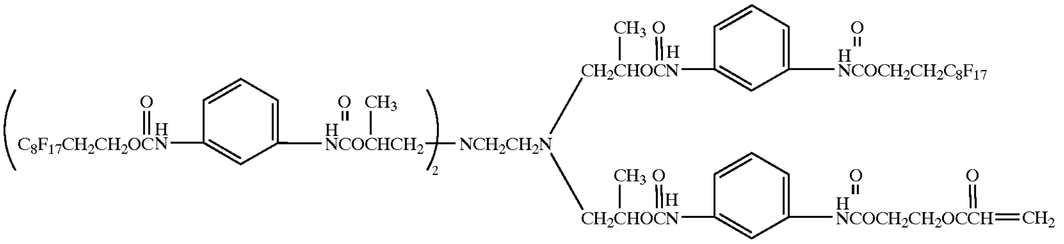
A-23
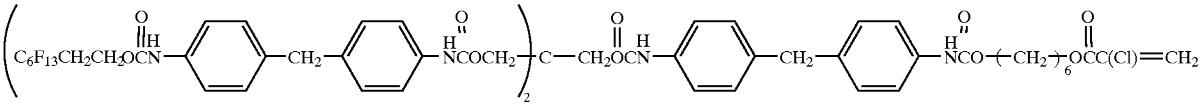
A-24
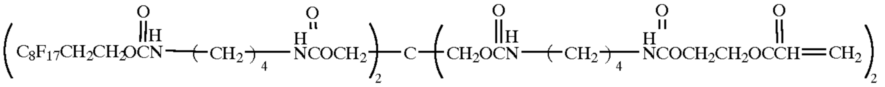
A-25
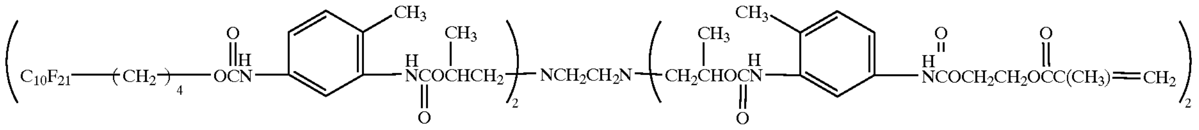
A-26
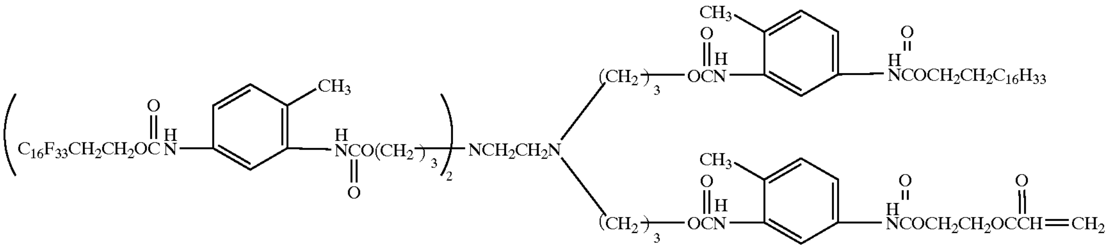
A-27
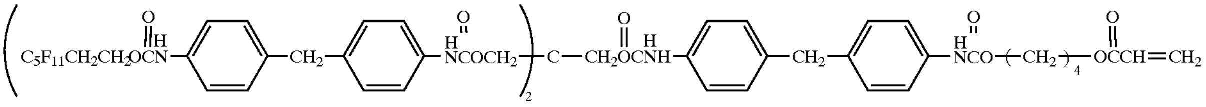
A-28
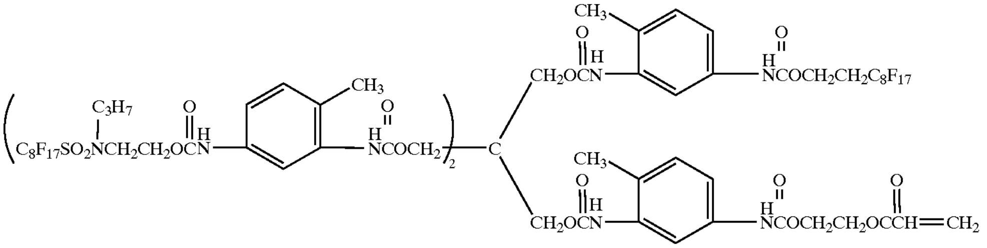
A-29
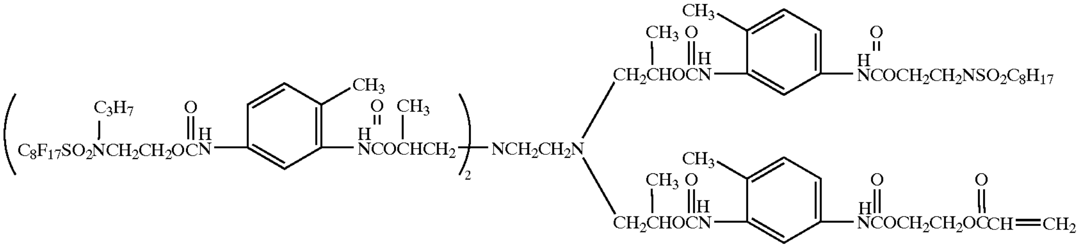

-continued

A-30

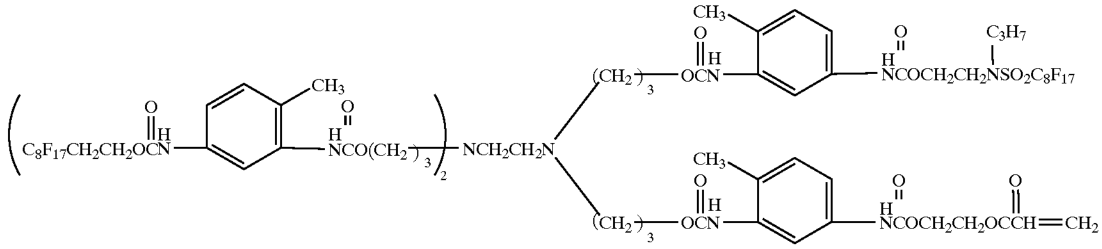

A-31

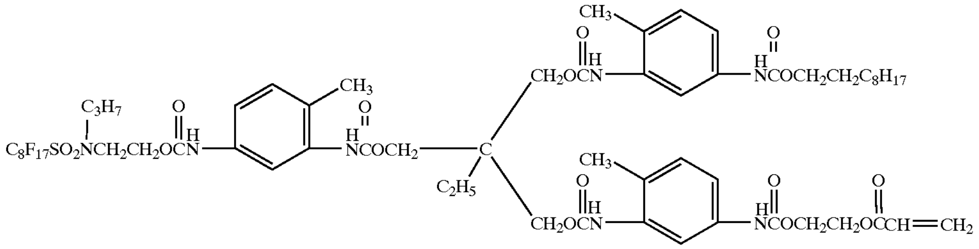

A-32

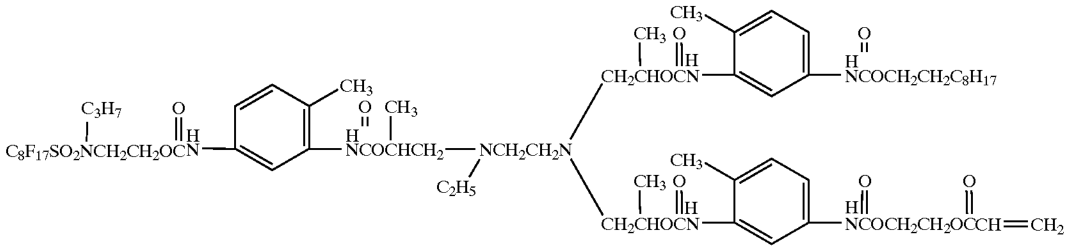

A-33

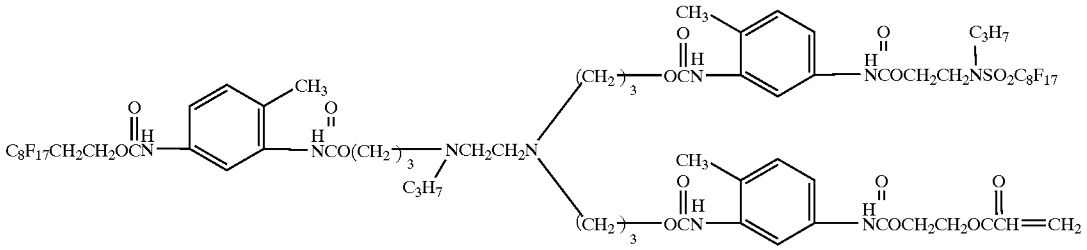

Also, the polymer (C) may be a copolymer between a (meth)acrylate monomer having within the molecule 2 or 3 perfluoroalkyl groups containing 3 to 20 carbon atoms and a hydrocarbon (meth)acrylate monomer. The hydrocarbon (meth) acrylate monomer preferably has a hydroxyl group and may be used in combination with a hydrocarbon acrylate.

The hydrocarbon acrylates have 1 or 2 acryloyl groups, and may properly be selected from among those which are well-known in this field (for example, compounds described in "UV Koka Gijutsu Nyumon" written by Kiyomi Kato & Shoji Nakahara and published by Kobunshi Kankokai, Table 10 on pp.34–35, Table 16 on pp.46 to 48, Table 20 on p.57 and Table 60 on pp.170 to 172). For example, there are illustrated the following ones (B-1 to B-9).

B-1 (wherein $R^4$ represents an alkyl group containing 1 to 20 carbon atoms)

$CH_2{=}C(R^3)COOR^4$

B-2

$CH_2{=}C(R^3)COOCH_2CH_2OH$

B-3

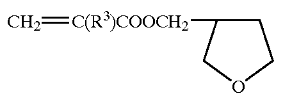

B-4

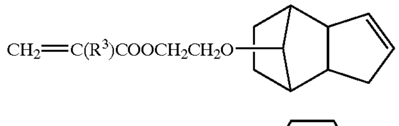

B-5

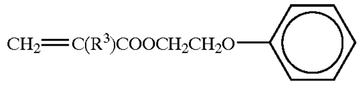

-continued

B-6

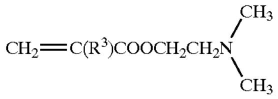

B-7

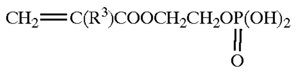

B-8

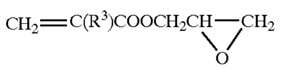

B-9

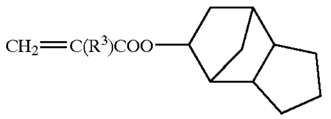

(wherein $R^3$ represents —H or —CH3)

The molecular weight of the polymer (C) is not particularly limited, but is preferably 3,000 to 200,000 in weight average molecular weight, with 4,000 to 100,000 being more preferred.

Also, the amount of the polymer (C) to be added is preferably 0.01 to 10% by weight based on the weight of the total solid components in the heat-sensitive layer which constitutes the lithographic printing plate of the present invention adapted for infrared laser, with 0.1 to 5% by weight being more preferred.

(D) A fluorine-containing polymer containing as copolymerizable components at least following 1) to 3)(hereinafter also referred to as polymer (D)):

1) an addition polymerizable, fluorine-containing monomer having in the side chain a fluoro aliphatic group wherein hydrogen atoms on the carbon atoms are replaced by fluorine atoms;

2) a monomer of the following structure [1] to [4]; and 3) a monomer having an acidic hydrogen atom and having an acidic group wherein the acidic hydrogen atom is bound to a nitrogen atom:

$CH_2{=}CA^1[CO{—}W{—}R^2]$ [1]

$CH_2{=}CA^1[O{—}CO{—}R^3]$ [2]

$CH_2{=}CA^1[U]$ [3]

[4]

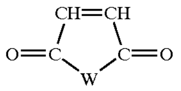

wherein A1 represents a hydrogen atom, a halogen atom or an alkyl group, W represents oxygen or $—NR^1—$, $R^1$ represents a hydrogen atom, an alkyl group or an aryl group, R2 represents an optionally substituted alkyl group or an optionally substituted aryl group, R3 represents an alkyl group or an aryl group, and U represents a cyano group, an aryl group, an alkoxy group, an aryloxy group, an acyloxymethyl group, a nitrogen-containing hetero ring or $—CH_2OCOR^3$ ($R^3$ being the same as defined above).

The polymer (D) to be used in the present invention contains at least the above-described 1) to 3) as copolymerizable components.

The fluoro aliphatic group of the component 1), wherein hydrogen atoms on the carbon atoms are replaced by fluorine atoms, is a usually saturated and generally monovalent or divalent aliphatic group. It includes straight, branched and cyclic ones.

In order to fully exhibit the effects of the present invention, the fluoro aliphatic group contains 3 to 20, preferably 6 to 12, carbon atoms and has fluorine atoms bound to carbon atoms in a content of 40% by weight or more, preferably 50% by weight or more, of the total weight of the fluorine-containing monomer. Preferred fluoro aliphatic groups are perfluoro aliphtaic groups which are substantially completely or fully fluorinated (hereinafter also referred to as Rf group), such as $CnF_{2n+1}—$ (wherein n represents an integer of 1 or more, preferably 3 or more).

As the addition polymerizable moiety in the addition polymerizable monomer which is represented as component (1) and which has the fluoro aliphtaic group wherein hydrogen atoms on the carbon atoms are replaced by fluorine atoms, vinyl having a radically polymerizable unsaturated group and the derivatives thereof may be used. Of the addition polymerizable moieties, acrylates, methacrylates, acrylamide, methacrylamide, styrene, vinyl and the derivatives thereof are preferred.

Specific examples of the acrylate and the methacrylate to which the fluoro aliphatic group is bound include those compounds which are represented by Rf-R'—OOC—C(R") $=CH_2$ (wherein R' represents, for example, a single bond, alkylene, sulfonamidoalkylene or carbonamidoalkylene, and R" represents a hydrogen atom, a methyl group, a halogen atom or a perfluoro aliphatic group).

As specific examples thereof, there are illustrated those described in U.S. Pat. Nos. 2,803,615, 2,642,416, 2,826,564, 3,102,103, 3,282,905 and 3,304,278, Japanese Patent Laid-Open Nos. 256289/1994, 1116/87, 48772/87, 77574/88 and 36657/87, and Nihon Kagaku Kai-Shi No. 10 (1985), pp.1884 to 1888. In addition to these fluoro aliphatic group-bound monomers, those fluoro aliphatic group-bound macromers which are described in Reports Res. Lab. Asahi Glass Co., Ltd., vol.34 (1984), pp.27 to 34 may preferably be used.

Also, as the fluoro aliphatic group-bound monomers, a mixture of different lengths of perfluoroalkyl groups as represented by the following structural formula may be used.

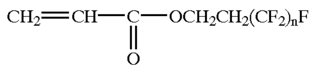

n = 6, 8, 10, 12

The content of fluoro aliphatic group-containing monomer for use in the polymer (D) to be used in the present invention is from 3 to 70% by weight, preferably from 7 to 40% by weight, based on the weight of the polymer.

Monomers to be used as component (2) are represented by the following structures [1] to [4]:

$CH_2{=}CA^1[CO{—}W{—}R^2]$ [1]

$CH_2{=}CA^1[O{—}CO{—}R^3]$ [2]

$CH_2{=}CA^1[U]$ [3]

[4]

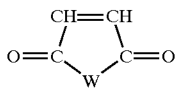

wherein $A^1$ represents a hydrogen atom, a halogen atom or an alkyl group, W represents oxygen or $—NR^1—$, $R^1$ represents a hydrogen atom, an alkyl group or an aryl group, $R^2$ represents an optionally substituted alkyl group or an optionally substituted aryl group, $R^3$ represents an alkyl group or an aryl group, and U represents a cyano group, an aryl group, an alkoxy group, an aryloxy group, an acyloxymethyl group, a nitrogen-containing hetero ring or $—CH_2OCOR^3$ ($R^3$ being the same as defined above).

Preferred monomers represented by the structures [1] to [4] are those wherein $A^1$ represents a hydrogen atom, a halogen atom or an alkyl group containing 1 to 4 carbon atoms, W represents oxygen or $—NR^1—$, and $R^1$ represents a hydrogen atom, an alkyl group containing 1 to 20 carbon atoms or an aryl group containing 6 to 20 carbon atoms, $R^2$ represents an optionally substituted alkyl group containing 1 to 8 carbon atoms or an optionally substituted aryl group, $R^3$ represents an alkyl group containing 1 to 20 carbon atoms or an aryl group containing 6 to 20 carbon atoms, and U represents a cyano group, an aryl group, an alkoxy group, an aryloxy group, an acyloxymethyl group, a nitrogen-containing hetero ring or $—CH_2OCOR^3$ ($R^3$ being the same as defined above).

Where $R^2$ represents an optionally substituted alkyl group, the substituent is exemplified by a halogen atom (e.g., fluorine, chlorine or bromine), a hydroxyl group, an alkoxy group (e.g., methooxy or ethoxy), an aryloxy group (e.g., phenoxy), a cyano group, an amido group (e.g., acetamido), and alkoxycarbonyl group (e.g., ethoxycarbonyl).

Where $R^2$ represents an optionally substituted aryl group, the substituent is exemplified by a methyl group in addition to the above-described ones.

Preferred specific compounds of the component (2) are illustrated below. There are illustrated (meth)acrylic esters such as methyl (meth)acrylate, ethyl (meth)acrylate, propyl (meth)acrylate, butyl (meth)acrylate, amyl (meth)acrylate, 2-ethylhexyl (meth) acrylate, octyl (meth)acrylate, 2-chloroethyl (meth)acrylate, cyclohexyl (meth)acrylate, 2-hydroxyethyl (meth)acrylate, 2-hydroxypropyl (meth) acrylate, 2-hydroxybutyl (meth) acrylate, diethylene glycol mono(meth)acrylate, 2-hydroxy-3-phenoxypropyl (meth) acrylate, glycidyl (meth)acrylate, diethyalminoethyl (meth) acrylate, furfuryl (meth) acrylate, tetrahydrofuryl (meth) acrylate, phenyl (meth)acrylate, hydroxyphenyl (meth) acrylate, cresyl (meth)acrylate, naphthyl (meth)acrylate, benzyl (meth)acrylate, methoxybenzyl (meth)acrylate, etc.; (meth)acrylamides such as (meth)acrylamide, N-ethyl (meth)acrylamide, N-propyl(meth)acrylamide, N-butyl (meth)acrylamide, N-hexyl(meth)acrylamide, N-octyl (meth)acrylamide, N-cyclohexyl(meth)acrylamide, N-methylol(meth)acrylamide, N-hydroxyethyl(meth) acrylamide, N-benzyl(meth)acrylamide, N-phenyl(meth) acrylamide, N-nitrophenyl(meth)acrylamide, N-tolyl (meth) acrylamide, N-hydroxyphenyl (meth) acrylamide, N,N-dimethyl(meth)acrylamide, N,N-diethyl(meth)acrylamide, N,N-dicyclohexyl(meth)acrylamide, etc.; N-substituted maleimides such as N-methylmaleimide, N-ethylmaleimide, N-propylmaleimide, N-butylmaleimide, N-pentylmaleimide, N-n-hexylmaleimide, N-laurylmaleimide, N-stearylmaleimide, N-cyclohexylmaleimide, N-phenylmaleimide, N-chlorophenylmaleimide, N-tolylmaleimide, N-hydroxymaleimide, N-benzylmaleimide, etc.; allyl compounds such as allyl acetate, allyl caproate, allyl stearate, allyloxyethanol, etc.; vinyl ether compounds such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether, diethylaminoethyl vinyl ether, etc.; vinyl esters such as vinyl acetate, vinyl butyrate, vinyl caproate, vinyl chloroacetate, vinyl methoxyacetate, vinyl phenylacetate, vinyl acetoacetate, vinyl benzoate, vinyl chlorobenzoate, etc.; styrenes such as styrene, α-methylstyrene, methylstyrene, dimethylstyrene, chloromethylstyrene, ethoxymethylstyrene, hydroxystyrene, chlorostyrene, bromostyrene, etc.; N-vinylpyrrolidone; N-vinylpyridine; and acrylonitrile.

Of these components (2), particularly preferred are those monomers which are represented by the structure [1] or [3].

As the acidic group in the component (3) which has an acidic hydrogen atom or atoms bound to a nitrogen atom, any of acidic groups known by literature may be used. Such known literature includes J. A. Dean ed., Lange's Handbook of Chemistry, 3rd. ed., (1985) McGraw-Hill Book Co.

Of the acidic groups, there are illustrated those which have a specific partial structure of the acidic group wherein an acidic hydrogen is bound to a nitrogen atom and which is represented by the following formulae [A] to [G]:

$—SO_2NH_2$ [A]

$—SO_2NH—$ [B]

$—CONHSO_2—$ [C]

$—CONHCO—$ [D]

$—SO_2NHSO_2—$ [E]

$—CONHSO_2NH—$ [F]

$—NHCONHSO_2—$ [G]

In addition to these structures, there are included nitrogen-containing hetero ring structures having a coupler structure described in Japanese Patent Laid-Open No. 2448628/1995. Examples of the nitrogen-containing hetero ring structure include those represented by the following [H] and [I]:

[H]

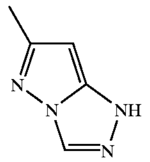

[I]

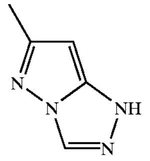

As the addition polymerizable moiety in the addition polymerizable monomer which is represented as component (3) and which has an acidic hydrogen atom or atoms bound to a nitrogen atom, vinyl compounds having a radically polymerizable unsaturated group and derivatives thereof are used. Of the addition polymerizable moieties, acrylates, methacrylates, acrylamide, methacrylamide, styrene, vinyl and derivatives thereof are preferred.

As the preferred structure of the acidic group-containing monomers having an acidic hydrogen atom or atoms bound to a nitrogen atom, there may be illustrated, for example, those monomers which have a structural unit represented by the following formula [5], [6] or [7]:

$CH_2{=}CA^2[(B)m\text{-}(X)_s\text{—}NH\text{—}Y]$ [5]

$CH_2{=}CA^2[CO\text{-}Z\text{-}E\text{-}SO_2NH\text{—}R^5]$ [6]

In the above formulae, $A^2$ represents a hydrogen atom, a halogen atom or an alkyl group containing 1 to 4 carbon atoms. B represents an arylene group. X represents —CO— or —$SO_2$—. When X represents —$SO_2$—, Y represents a hydrogen atom, an alkyl group, an aryl group, —CO—$R^4$ or —SO2—$R^4$ and, when X represents —CO—, Y represents —CO—$R^4$ or —$SO_2$—$R^4$. Z represents —NH—, —$NR^4$— or —O—. E represents an arylene group or an alkylene group.

$R^5$ represents a hydrogen atom, an alkyl group or an aryl group, m and s each represents 0 or 1, provided that m and s do not represent 0 at the same time. $R^4$ represents an alkyl group or an aryl group. Also, B and Y, or E and $R^5$, may be bound to each other to form a ring composed of non-metallic atoms.

[7]

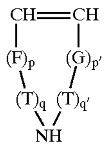

F and G each represents a phenylene group or an alkylene group. T represents —O—CO—, —CO— or —$SO_2$—. p, p', q and q' each represents 0 or 1, with the proviso that q and q' do not represent 0 at the same time.

In the foregoing general formulae [5] and [6], $A^2$ preferably represents a hydrogen atom or a methyl group. As preferred examples of the alkyl group represented by Y, $R^4$ or $R^5$, there are illustrated alkyl groups containing 1 to 20 carbon atoms such as methyl, ethyl and isopropyl and, as preferred examples of the aryl group represented by Y, $R^4$ or $R^5$, there are illustrated aryl groups containing 6 to 18 carbon atoms such as phenyl and naphthyl. As preferred examples of the arylene group represented by B or E, there are illustrated phenylene and naphthylene and, as preferred examples of the alkylene group represented by E, there are illustrated alkylene groups containing 1 to 20 carbon atoms such as methylene and ethylene.

The alkyl group and the aryl group represented by Y, $R^4$ or $R^5$ and the arylene group and the alkylene group represented by B or E may have a substituent or substituents. As such substituents, there are illustrated a halogen atom such as fluorine, chlorine or bromine, an alkoxy group such as methoxy or ethoxy, an aryloxy group such as phenoxy, a cyano group, an amido group such as acetamido group, an alkoxycarbonyl group such as ethoxycarbonyl, an alkyl group containing 1 to 20 carbon atoms, and an aryl group containing 6 to 18 carbon atoms.

In the foregoing general formula [7], preferred examples of F and G are the same as those illustrated with respect to B or E. Additionally, of the monomers represented by the foregoing general formulae [5] to [7], monomers of [5] and [6] are more preferred.

The amount of these acidic group-containing monomers to be used in the fluorine-containing polymer to be used in the present invention is 5 to 80% by weight based on the weight of the polymer, with 10 to 70% by weight being preferred. Examples of specific structures of the acidic group-containing monomers to be used in the present invention wherein an acidic hydrogen atom or atoms are bound to a nitrogen atom are shown below.

M-1

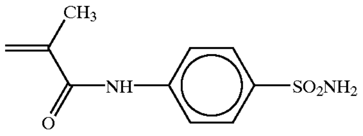

M-2

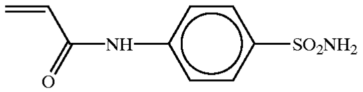

M-3

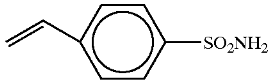

M-4

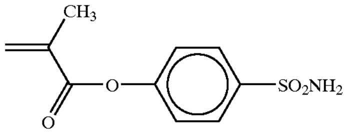

M-5

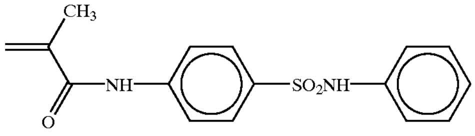

M-6

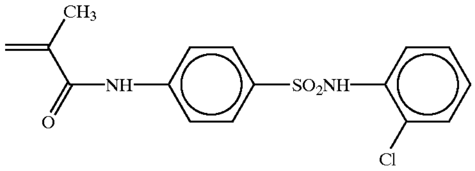

M-7

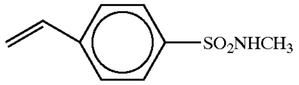

M-8

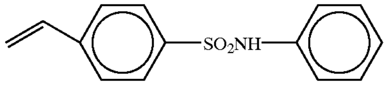

M-9

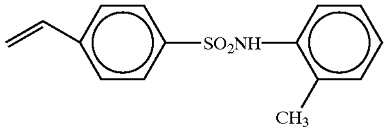

M-10

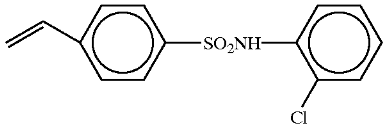

M-11

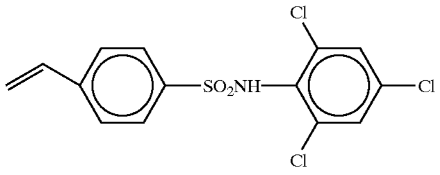

-continued
M-12
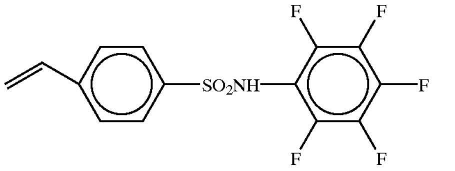
M-13
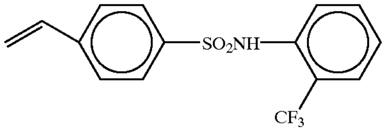
M-14
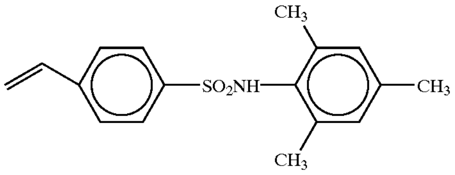
M-15
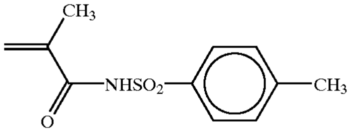
M-16
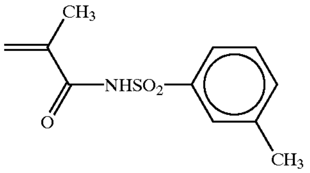
M-17
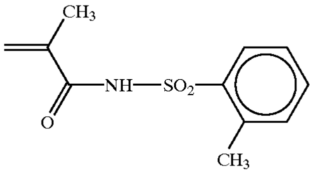
M-18
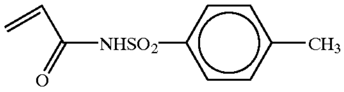
M-19
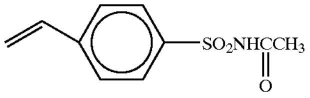
M-20
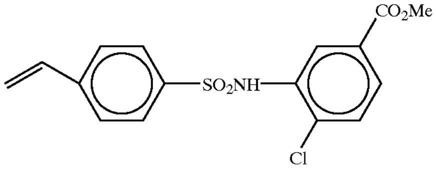
-continued
M-21
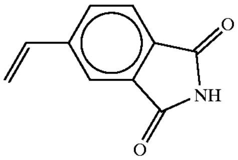
M-22
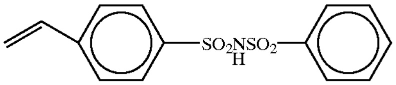
M-23
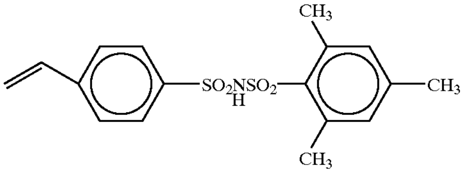
M-24
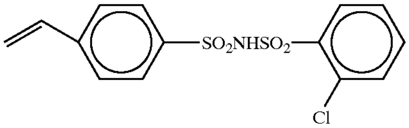
M-25
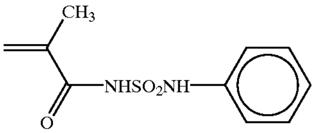
M-26
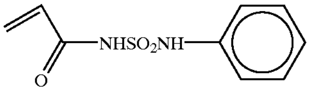
M-27
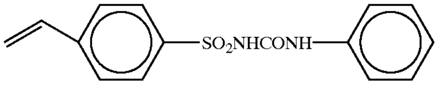
M-28
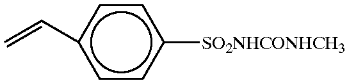
M-29
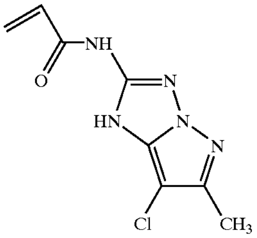
M-30
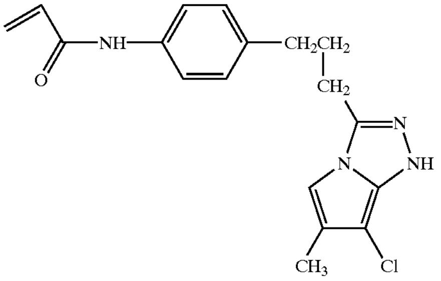

-continued

M-31

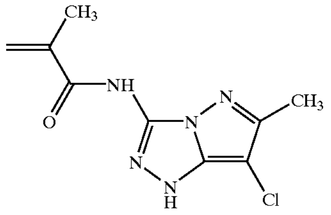

The fluorine-containing polymers of the present invention may be produced by conventionally known processes. For example, they may be produced by thermal polymerization between a fluoro aliphatic group-having (meth)acrylate, an aliphatic or aromatic group-having (meth) acrylate and an acidic group-having vinyl monomer wherein an acidic hydrogen atom or atoms are bound to a nitrogen atom in an organic solvent in the presence of a general-purpose radical polymerization initiator. Or, in some cases, they may be produced in the same manner as described above with adding other addition polymerizable unsaturated compounds.

As the other addition polymerizable unsaturated compounds to be used in some cases, those may be used which are described in Polymer Handbook, 2nd ed., J. Brandrup, Wiley Interscience (1975), Chapter 2, pages 1 to 483.

They are exemplified by (meth) acrylates such as methyl (meth)acrylate, ethyl (meth)acrylate, 2-chloroethyl (meth) acrylate, 2-hydroxyethyl (meth)acrylate and glycidyl (meth) acrylate; (meth)acrylamides such as (meth)acrylamide, N-ethyl(meth)acrylamide, N-propyl(meth)acrylamide, N-methylol(meth)acrylamide, N,N-dimethyl(meth) acrylamide, N-hydroxyethyl(meth)acrylamide and N-(p-hydroxyphenyl) (meth) acrylamide; allyl compounds such as allyl acetate, allyl caproate and allyloxyethanol; vinyl ethers such as ethyl vinyl ether, propyl vinyl ether, butyl vinyl ether, octyl vinyl ether, methoxyethyl vinyl ether, ethoxyethyl vinyl ether, 2-chloroethyl vinyl ether, hydroxyethyl vinyl ether, benzyl vinyl ether, tetrahydrofurfuryl vinyl ether, phenyl vinyl ether, tolyl vinyl ether and diethylaminoethyl vinyl ether; vinyl esters such as vinyl acetate, vinyl butyrate, vinyl caproate, vinyl chloroacetate, vinyl methoxyacetate, vinyl phenylacetate, vinyl acetoacetate, vinyl benzoate and vinyl chlorobenzoate; styrenes such as styrene, α-methylstyrene, methylstyrene, dimethylstyrene, chloromethylstyrene, ethoxymethylstyrene, hydroxystyrene, chlorostyrene and bromostyrene; vinyl ketones such as methyl vinyl ketone, ethyl vinyl ketone, propyl vinyl ketone and phenyl vinyl ketone; olefins such as isobutylene, butadiene and isoprene; and others such as butyl crotonate, dimethyl itaconate, diethyl itaconate, dimethyl maleate, diethyl fumalate, N-vinylpyrrolidone, N-vinylpyridine and acrylonitrile.

In addition to these monomers, there may be used those polyoxyalkylene (meth) acrylates described in Japanese Patent Laid-Open Nos. 226143/1987 and 172849/1991.

Examples of specific structures of the fluorine-containing polymers by the present invention are shown below. Additionally, numerals in the formulae represent molar ratios of respective monomer components.

P-1

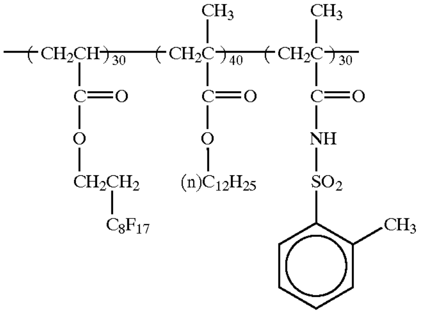

P-2

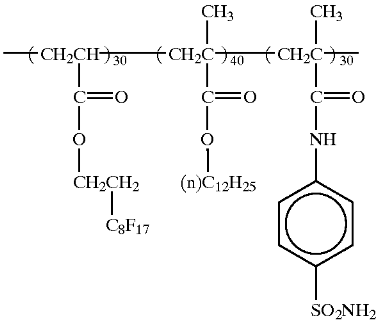

P-3

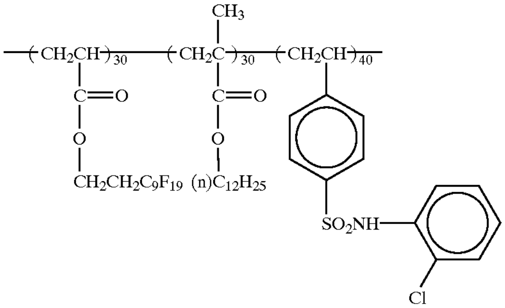

P-4

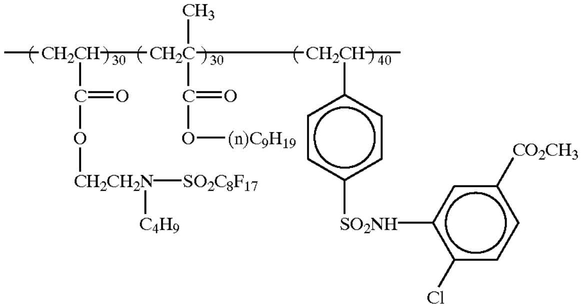

P-5

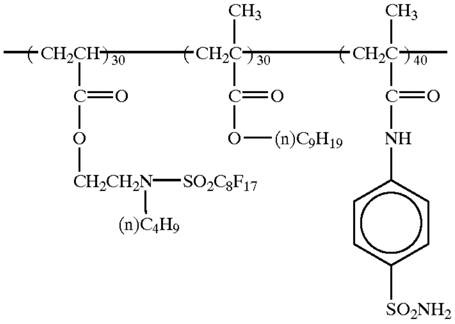

-continued
P-6
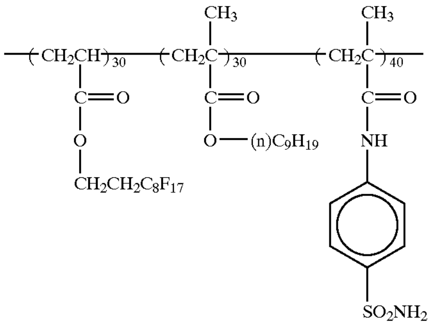
P-7
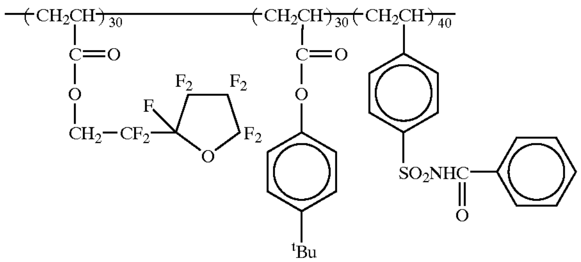
P-8
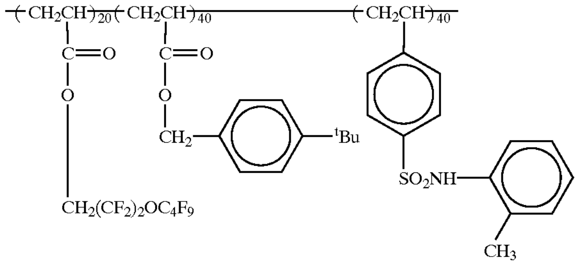
P-9
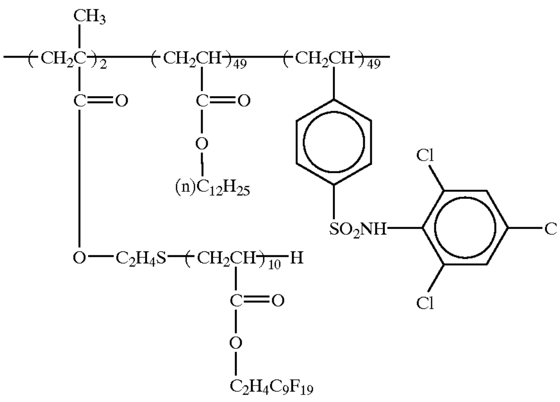
-continued
P-10
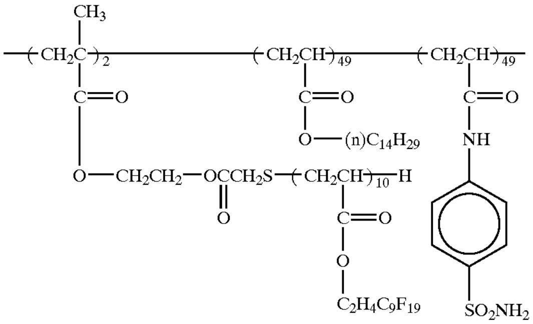
P-11
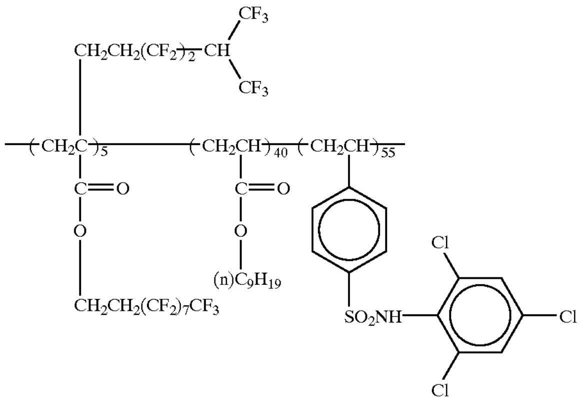
P-12
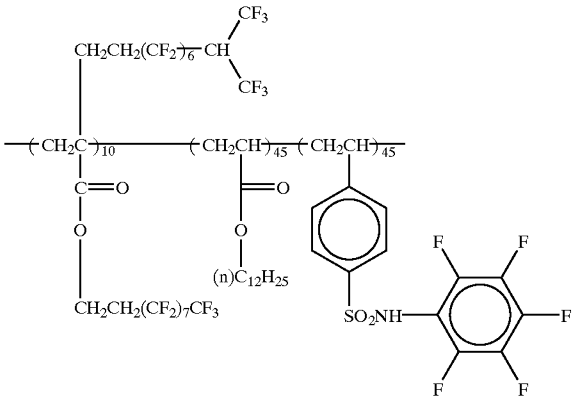
P-13
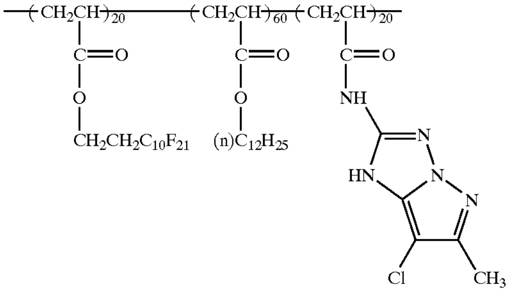

The molecular weight of the polymer (D) to be used in the invention ranges from 3,000 to 200,000 in terms of average molecular weight, with 6,000 to 100,000 being preferred.

The amount of the polymer (D) to be used in the invention ranges from 0.001 to 10% by weight, more preferably from 0.01 to 5% by weight, based on the whole solid components in the heat-sensitive layer constituting the lithographic printing plate of the invention adapted for infrared laser.

(B) Alkaline aqueous solution-soluble resin having phenolic hydroxyl groups

As the alkaline aqueous solution-soluble resin having phenolic hydroxyl groups (hereinafter referred to as "phenolic hydroxyl groups-having resin", there are illustrated, for example, novolak resins such as phenol-formaldehyde resin, m-cresol-formaldehyde resin, p-cresol-formaldehyde resin, m-/p-mixed cresol-formaldehyde resin and phenol/cresol (any of m-cresol, p-cresol or m-/p-mixture) mixed formaaldehyde resin.

These phenolic hydroxyl groups-having resins preferably have a weight average molecular weight of 500 to 20,000 and a number average molecular weight of 200 to 10,000. Further, they may be used in combination with a condensation product between phenol having a substituent of an alkyl group containing 3 to 8 carbon atoms and formaldehyde, such as t-butylphenol-formaldehyde resin and octylphenol-formaldehyde resin, as described in U.S. Pat. No. 4,123,279. Such phenolic groups-having resins may be used alone or in combination of two or more.

In the invention, it is preferred to use the phenolic hydroxyl groups-having resin in combination with a copolymer containing at least one of (4) to (6) as a copolymerizable component in a content of 10 mol % or more (hereinafter referred to as "specific copolymer" or "component (E)"

The specific copolymer of the invention is required to contain at least one of (4) to (6) as a copolymerizable component in a content of 10 mol % or more, more preferably 20 mol % or more. In case where the content is less than 10 mol %, there results an insufficient mutual action with the phenolic hydroxyl groups-having resin, leading to reduction in development latitude. In addition, the copolymer may further contain other copolymerizable components than (4) to (6) described above.

The monomer corresponding to (4) is a monomer composed of a low molecular compound having within the molecule at least one sulfonamido group wherein at least one hydrogen atom is bound to the nitrogen atom and at least one polymerizable unsaturated bond. Among them, those low molecular compounds are preferred which have an acryloyl group, an allyl group or a vinyloxy group and a substituted or monosubstituted aminosulfonyl group or a substituted sulfonylimino group. are preferred which have an acryloyl group, an allyl group or a vinyloxy group and a substituted or monosubstituted aminosulfonyl group or a substituted sulfonylimino group.

As such compounds, there maybe illustrated, for example, the compounds represented by the following general formulae (I) to (V):

(I)

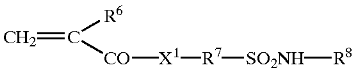

(II)

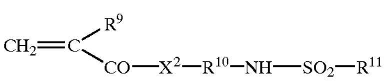

-continued (III)

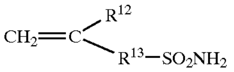

(IV)

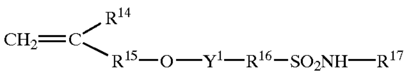

(V)

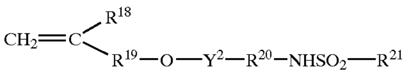

In the above formulae, $X^1$ and $X^2$ each represents —O— or —$NR^{22}$—. $R^6$, $R^9$, $R^{12}$, $R^{14}$ and $R^{18}$ each represents a hydrogen atom or —$CH_3$. $R^7$, $R^{10}$, $R^{13}$, $R^{16}$ and $R^{20}$ each represents an alkylene group containing 1 to 12 carbon atoms, cycloalkylene group, arylene group or aralkylene group, each of which may have a substituent or substituents, $R^8$, $R^{17}$ and $R^{22}$ represents a hydrogen atom or an alkyl group containing 1 to 12 carbon atoms, cycloalkyl group, aryl group or aralkyl group, each of which may have a substituent or substituents. $R^{11}$ and $R^{21}$ each represents an alkyl group containing 1 to 12 carbon atoms, cycloalkyl group, aryl group or aralkyl group, each of which may have a substituent or substituents. $R^{15}$ and $R^{19}$ each represents a single bond or an alkylene group containing 1 to 12 carbon atoms, cycloalkylene group, arylene group or aralkylene group, each of which may have a substituent or substituents. $Y^1$ and $Y^2$ each represents a single bond or —CO—.

Specifically, m-aminosulfonylphenyl methacrylate, N-(p-aminosulfonylphenyl)methacrylamide or N-(p-aminosulfonylphenyl)acrylamide may preferably be used.

The monomer corresponding to (5) is a monomer composed of a low molecular compound having within the molecule at least one active imino group represented by the following formula and at least one polymerizable unsaturated bond. As such compounds, specifically N-(p-toluenesulfonyl)methacrylimide The monomer corresponding to (6) is a monomer composed of an acrylamide, methacrylamide, acrylic ester, methacrylic ester or hydroxystyrene, each of which has a phenolic hydroxyl group. As such compounds, specifically N-4-hydroxyphenyl)acrylamide, N-(4-hydroxyphenyl) methacrylamide, o-hydroxyphenyl acrylate, m-hydroxyphenyl acrylate, p-hydroxyphenyl acrylate, o-hydroxyphenyl methacrylate, m-hydroxyphenyl methacrylate, p-hydroxyphenyl methacrylate, o-hydroxystyrene, m-hydroxystyrene and p-hydroxystyrene may preferably be used.

As other copolymerizable components, there are illustrated, for example, the monomers of (7) to (18):

(7) acrylic esters and methacrylic esters each having an aliphatic hydroxyl group, such as 2-hydroxyethyl acrylate or 2-hydroxyethyl methacrylate;

(8) alkyl acrylates such as methyl acrylate, ethyl acrylate, propyl acrylate, butyl acrylate, amyl acrylate, hexyl acrylate, octyl acrylate, benzyl acrylate, 2-chloroethyl acrylate, glycidyl acrylate and N-dimethylaminoethy acrylate;

(9) alkyl methacrylates such as methyl methacrylate, ethyl methacrylate, propyl methacrylate, butyl methacrylate, amyl methacrylate, hexyl methacrylate, cyclohexyl methacrylate, benzyl methacrylate, 2-chloroethyl methacrylate, glycidyl methacrylate and N-dimethylaminoethy methacrylate;

(10) acrylamides or methacrylamides such as acrylamide, methacrylamide, N-methylolacrylamide, N-ethylacrylamide, N-hexylmethacrylamide, N-cyclohexylacrylamide, N-hydroxyethylacrylamide, N-phenylacrylamide, N-nitrophenylacrylamide and N-ethyl-N-phenylacrylamide;

(11) vinyl ethers such as ethyl vinyl ether, 2-chloroethyl vinyl ether, hydroxyethyl vinyl ether, propyl vinyl ether, butyl vinyl ether, octyl vinyl ether and phenyl vinyl ether;

(12) vinyl esters such as vinyl acetate, vinyl chloroacetate, vinyl butyrate and vinyl benzoate;

(13) styrenes such as styrene, α-methylstyrene, methystyrene and chloromethylstyrene;

(14) vinyl ketones such as methyl vinyl ketone, ethyl vinyl ketone, propyl vinyl ketone and phenyl vinyl ketone;

(15) olefins such as ethylene, propylene, isobutylene, butadiene and isoprene;

(16) N-vinylpyrrolidone, N-vinylcarbazole, 4-vinylppyridine, acrylonitrile, methacrylonitrile, etc.;

(17) unsaturated imides such as maleimide, N-acryloylacrylamide, N-acetylmethacrylamide, N-propionylmethacrylamide and N-(p-chlorobenzoyl) methacrylamide; and

(18) unsaturated carboxylic acids such as acrylic acid, methacrylic acid, maleic anhydride and itaconic acid.

The specific copolymer of the present invention preferably has a weight average molecular weight of 2000 or more and a number average molecular weight of 1000 or more. More preferably, the weight average molecular weight is 5,000 to 300,000 and the number average molecular weight is 2,000 to 250,000, with degree of dispersion (weight average molecular weight/number average molecular weight) being 1.1 to 10.

Such specific copolymers may be used alone or in combination of two or more.

It is necessary to blend the phenolic hydroxyl groups-having resin and the specific copolymer in a weight ratio of 50:50 to 5:95, with 40:60 to 10:90 being more preferred. In case where the content of the phenolic groups-having resin is more than the range, the sea-island structure would be reversed, thus solvent resistance not being improved. Conversely, in case where the content of the copolymer exceeds the above-described range, there results a too thin surface layer formed by the phenolic groups-having resin, leading to an insufficient improvement in development latitude.

In the alkali-soluble high molecular compound composed of the phenolic groups-having resin and the specific copolymer, the resin component and the specific copolymer component may respectively be composed of one kind or more of the ingredients. The alkali-soluble high molecular compound is used in an amount of 30 to 99% by weight, preferably 40 to 95% by weight, particularly preferably 50 to 90% by weight, based on the whole solid components of the printing plate material.

In case where the amount of added alkali-soluble high molecular compound is less than 30% by weight, there results a deteriorated durability of the recording layer whereas, in case where the amount exceeds 99% by weight, there result unfavorable sensitivity and durability.

(A) A substance which absorbs a light to generate heat (also referred to as "light-heat converter")

In the present invention, various pigments or dyes may be used as the substance which absorbs a light to generate heat. As the pigments, there may be utilized commercially available pigments and those pigments which are described in Color Index (C.I.), "The latest Pigment Handbook" compiled by Nihon Ganryo Gijutsu Kyokai (1977), "The Latest Pigment Applied Technique" published by CMC Publishing Co. (1986) and "Printing Ink Technique" published by CMC Publishing Co. (1984).

Examples of the pigments include black pigments, yellow pigments, orange pigments, brown pigments, red pigments, purple pigments, blue pigments, green pigments, fluorescent pigments, metal powder pigments and polymer-attaching pigments. Specifically, insoluble azo pigments, azo lake pigments, condensation azo pigments, chelate azo pigments, phthalocyanine pigments, anthraquinone pigments, perylene and perinone pigments, thioindigo pigments, quinacridone pigments, dioxazine pigments, isoindolinone pigments, quinophthalone pigments, in-mold lake pigments, azine pigments, nitroso pigments, nitro pigments, natural pigments, fluorescent pigments, and carbon black can be used.

These pigments may be used without surface treatment or may be surface-treated. As methods of surface treatments, a method of surface-coating with resins and waxes, a method of adhering surfactants, and a method of attaching reactive substances (e.g., silane coupling agents, epoxy compounds and polyisocyanates) on the surface of pigments can be exemplified. These surface treatment methods are described in "Natures and Application of Metal Soaps" published by Saiwai Shobo Co., "Printing Ink Technique" published by CMC Publishing Co. (1984) and The Latest Pigment Applied Technique" published by CMC Publishing Co. (1986).

The particle size of pigments is preferably from 0.01 to 10 um, more preferably from 0.05 to 1 μm, particularly preferably from 0.1 to 1 μm. Particle size of pigments of less than 0.01 um is not preferred from the viewpoint of the stability of the dispersion in a photosensitive layer-coating solution while, in case where it exceeds 10 μm, it is not preferred in view of the uniformity of the photosensitive layer. As sispersing methods of pigments, known methods in the manufacture of inks and toners may be used. Examples of dispersing apparatus include an ultrasonic dispersing machine, a sand mill, an attritor, a pearl mill, a super-mill, a ball mill, an impeller mill, a disperser, a KD mill, a colloid mill, a dynatron, a three-roll mill, a pressure kneader, etc., and details are described in "The Latest Pigment Applied Technique" published by CMC Publishing Co.

As the dyes, commercially available dyes and known dyes described, for example, in "Dye Handbook" compiled by Yuki Gosei Kagaku Kyokai (1970) may be utilized. Specifically, azo dyes, metal complex azo dyes, pyrazolone azo dyes, anthraquinone dyes, phthalocyanine dyes, carbonium dyes, quinoneimine dyes, methine dyes, and cyanine dyes may be used. Of these pigments or dyes, those which absorb infrared rays or near infrared rays are particularly preferably used in the point that they are adapted for the laser devices which emit infrared rays or near infrared rays.

As such pigments which absorb infrared rays or near infrared rays, carbon blacks are preferably used. In addition, as dyes which absorb infrared rays or near infrared rays, there may be illustrated, for example, cyanine dyes described in Japanese Patent Laid-Open Nos. 125246/1983, 84356/1984, 202829/1984 and 78787/1985; methine dyes described in Japanese Patent Laid-Open Nos. 173696/1983, 181690/1983 and 194595/1983; naphthoquinone dyes described in Japanese Patent Laid-Open Nos. 112793/1983, 224793/1983, 48187/1984, 73996/1984, 52940/1985 and 63744/1985; squalilium dyes described in Japanese Patent Laid-Open No. 112792/1983; and cyanine dyes described in British Patent 434,875.

Further, near infrared-absorbing sensitizing dyes described in U.S. Pat. No. 5,156,938 are also preferably used. In addition, substituted arylbenzo (thio)pyrylium salts described in U.S. Pat. No. 3,881,924, trimethine thiapyrylium salts described in Japanese Patent Laid-Open No. 142645/1987 (corresponding to U.S. Pat. No. 4,327,169), pyrylium based compounds described in Japanese Patent Laid-Open Nos. 181051/1983, 220143/1983, 41363/1984, 84248/1984, 84249/1984, 146063/1984 and 146061/1984, cyanine dyes described in Japanese patent Laid-Open No. 216146/1984, pentamethine thiopyrylium salts described in U.S. Pat. No. 4,283,475, pyrylium compounds described in Japanese Patent Publication Nos. 13514/1993 and 19702/1993, Epolight III-178 and Epolight III-125 are particularly preferably used.

As another examples of particularly preferred dyes, there may be illustrated near infrared-absorbing dyes described in U.S. Pat. No. 4,756,993 as formulae (I) and (II).

These pigments or dyes may be added to the printing plate material in an amount of from 0.01 to 50% by weight, preferably from 0.1 to 10% by weight, based on the entire solid components of the material, and in the case of using dyes, they are added particularly preferably in an amount of from 0.5 to 10% by weight and, in the case of using pigments, they are added particularly preferably in an amount of from 3.1 to 10% by weight.

In case where the addition amount of pigments or dyes is less than 0.01% by weight, there results a lowered sensitivity whereas, in case where it exceeds 50% by weight, the uniformity of the photosensitive layer would be lost and the durability of the recording layer would be deteriorated.

These dyes or pigments may be added in the same layer with other components or, alternatively, another layer may be provided to add them thereto. In the case of providing another layer, they are preferably added to the layer adjacent to the layer which contains substances of the present invention which are thermally decomposable and substantially lower the solubility of binders when they are in the state not being decomposed. Dyes or pigments and binder resins are preferably added to the same layer, though they may be added to different layers.

[Other Components]

To the composition of the present invention for the heat-sensitive layer of printing plate material may further be added, as needed, various additives. For example, it is preferred to contain, in combination with the above-described components, those substances which are thermally decomposable and, in a state not being decomposed, substantially lower solubility of the aqueous alkaline solution-soluble high molecular compound, such as oinium salts, o-quinonediazide compounds, aromatic sulfone compounds and aromatic sulfonic acid esters, in view of improving prevention of the image areas from being dissolved into a developing solution. Examples of the onium salts include a diazonium salt, an ammonium salt, a phosphonium salt, an iodonium salt, a sulfonium salt, a selenonium salt and an arsonium salt.

As preferred examples of the onium salts to be used in the present invention, there are illustrated, for example, diazonium salts described in S. I. Schlesinger, Photogr. Sci. Eng., 18, 387 (1974), T. S. Bal et al, Polymer, 21, 423 (1980), and Japanese Patent Laid-Open No. 158230/1993; ammonium salts described in U.S. Pat. Nos. 4,069,055 and 4,069,056, and Japanese Patent Laid-Open No. 140140/1991 (1984); phosphonium salts described in D. C. Necker et al, Macromolecules, 17, 2468 (1984), C. S. Wen et al, Teh, Proc. Conf. Rad. Curing ASIA, p.478 Tokyo, October (1988), U.S. Pat. Nos. 4,069,055 and 4,069,056; iodonium salts described in J. V. Crivello et al, Macromolecules, 10 (6), 1307 (1977), Chem. & Eng. News, No. v. 28, p31 (1988), European Patent 104,143, U.S. Pat. Nos. 339,049, 410,201, Japanese Patent Laid-Open Nos. 150848/1990 and 296514/1990; sulfonium salts described in J. V. Crivello et al, Polymer J. 17, 73(1985), J. V. Crivello et al, J. Org. Chem., 43, 3055 (1978), W. R. Watt et al, J. Polymer Sci., Polymer Chem. Ed., 22, 1789 (1984), J. V. Crivello et al , Polymer Bull., 14, 279 (1985), J. V. Crivello et al, Macromolecules, 14(5), 1141 (1981), J. V. Crivello et al, J. Polymer Chem. Ed., 17, 2877 (1979), European Patents 370,693, 233,567, 297,443 and 297,442, U.S. Pat. Nos. 4,933,377, 3,902,114, 410,201, 339,049, 4,760,013, 4,734,444 and 2,833,827, German Patent Nos. 2,904,626, 3,604,580 and 3,604,581; selenonium salts described in J. V. Crivello et al, Macromolecules,10(6), 1307 (1977) and J. V. Crivello et al, J. Polymer Sci., Polymer Chem. Ed., 17, 1047 (1979).; and arsonium salts described in C. S. Wen et al, Teh, Proc. Conf. Rad. Curing ASIA, p478 Tokyo, October (1988).

In the present invention, diazonium salts are particularly preferred. Particularly preferred diazonium salts include those which are described in Japanese Patent Laid-Open No. 158230/1993.

Preferred quinonediazides include o-quinonediazide compounds. o-quinonediazide compounds to be used in the present invention are those compounds which have at least one o-quinonediazide group and which show an increased alkali solubility when thermally decomposed. That is, upon thermal decomposition thereof, the o-quinonediazides help the light-sensitive system to be dissolved owing to the effect of losing the ability of inhibiting dissolution of the binder and the effect of changing themselves into alkali-soluble substances.

As the o-quinonediazide compounds to be used in the present invention, there may be used, for example, those which are described in J. Coser, "Light-sensitive Systems", John, Wiley & Sons. Inc., pp. 339 to 352. In particular, sulfonic acid esters or sulfonic acid amides of o-quinonediazides reacted with various aromatic polyhydroxy compounds or aromatic amino compounds are preferred. In addition, esters between benzoquinone(1,2)-diazidosulfonyl chloride or naphthooquinone-(1,2)-diazido-5-sulfonyl chloride and a pyrogallol-acetone resin as described in Japanese Patent Publication No. 28403/1968 and esters between benzoquinone-(1,2)-diazidosulfonyl chloride or naphthoquinone-(1,2)-diazido-5-sulfonyl chloride and a phenol-formaldehyde resin described in U.S. Pat. Nos. 3,046,120 and 3,188,210 are also preferably used.

Further esters between naphthoquinone-(1,2)-diazido-4-sulfonyl chloride and a phenol-formaldehyde resin or a cresol-formaldehyde resin, and an ester between naphthoquinone-(1,2)-diazido-4-sulfonyl chloride and a pyrogallol-acetone resin are similarly preferably used.

Other useful o-quinonediazide compounds have been reported in many patents. Examples thereof are described in, for example, Japanese Patent Laid-Open Nos. 5303/1972, 63802/1973, 63803/1973, 96575/1973, 38701/1974and 13354/1973, Japanese Patent Publication Nos. 11222/1966, 9610/1970 and 17481/1974, U.S. Pat. Nos. 2,797,213, 3,454,400, 3,544,323, 3,573,917, 3,674,495 and 3,785,825, British Patent Nos. 1,227,602, 1,251,345, 1,267,005, 1,329,888 and 1,330,932 and German Patent 854,890.

The addition amount of o-quinonediazide compounds is preferably from 1 to 50% by weight, more preferably from 5 to 30% by weight, particularly preferably from 10 to 30% by weight, based on the entire solid components of the printing plate material. These compounds may be used alone or as a mixture of two or more.

As counter ions of the onium salts, there are illustrated tetrafluoroborate, hexafluorophosphate, triisopropylnaphthalenesulfonate, 5-nitro-o-toluenesulfonate, 5-sulfosalicylate, 2,5-dimethylbenzenesulfonate, 2,4,6-trimethylbenzenesulfonate, 2-nitrobenzenesulfonate, 3-chlorobenzenesulfonate, 3-bromobenzenesulfonate, 2-fluorocaprylnaphthalenesulfonate, dodecylbenzenesulfonate, 1-naphthol-5-sulfonate, 2-methoxy-4-hydroxy-5-benzoyl-benzenesulfonate and p-toluenesulfonate. Of these, hexafluorophosphate and alkylaromatic sulfonates such as triisopropylnaphthalenesulfonate and 2,5-dimethylbenzenesulfonate are preferred.

The addition amount of additives other than the o-quinonediazide compounds ispreferablyfroml to 50% by weight, more preferably from 5 to 30% by weight, particularly preferably from 10 to 30% by weight. The additives and the binder of the present invention are preferably incorporated in the same layer.

In order to further improve sensitivity, cyclic acid anhydrides, phenols and organic acids may be used as well. Examples of the cyclic acid anhydrides include, as described in U.S. Pat. No. 4,115,128, phthalic anhydride, tetrahydrophthalic anhydride, hexahydrophthalic anhydride, 3,6-endoxy-Δ4-tetrahydrophthalic anhydride, tetrachlorophthalic anhydride, maleic anhydride, chloromaleic anhydride, α-phenylmaleic anhydride, succinic anhydride and pyromellitic anhydride. Examples of the phenols include bisphenol A, p-nitrophenol, p-ethoxyphenol, 2,4,4'-trihydroxybenzophenone,2,3,4-trihydroxybenzophenone, 4-hydroxybenzophenone, 4,4',4"-trihydroxytriphenylmethane and 4,4',3",4"-tetrahydroxy-3,5,3',5'-tetramethyltriphenylmethane.

Further, examples of the organic acids include, as are described in Japanese Patent Laid-Open Nos. 88942/1985 and 96755/1990, sulfonic acids, sulfinic acids, alkylsulfric acids, phosphonic acids, phosphates and carboxylic acids, specifically, p-toluenesulfonic acid, dodecylbenzenesulfonic acid, p-toluenesulfinic acid, ethylsullfuric acid, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid and ascorbic acid.

The content of the cyclic acid anhydrides, phenols and organic acids in the printing plate material is preferably from 0.05 to 20% by weight, more preferably from 0.1 to 15% by weight, particularly preferably from 0.1 to 10% by weight.

To the printing plate material of the present invention may be added, for widening the processing stability against development conditions, nonionic surfactants as described in Japanese Patent Laid-Open Nos. 251740/1987 and 208514/1992, and amphoteric surfactants as described in Japanese Patent Laid-Open Nos. 121044/1984 and 13149/1992. Specific examples of the nonionic surfactants include sorbitan tristearate, sorbitan monopalmitate, sorbitan trioleate, stearic acid monoglyceride and polyoxyethylene nonylphenyl ether.

Specific examples of the amphoteric surfactants include alkyldi(aminoethyl)glycine, alkylpolyaminoethylglycine hydrochloride, 2-alkyl-N-carboxyethyl-N-hydroxyethylimidazolinium betaine and N-tetradecyl-N,N-betaine type surractants (e.g., Amorgen K; trade name; manufactured by Daiichi Kogyo Seiyaku Co., Ltd.). The content of these nonionic surfactants and amphoteric surfactants in the printing plate material is preferably from 0.05 to 15% by weight, more preferably from 0.1 to 5% by weight.

Printing out agents for obtaining a visible image immediately after heating by exposure, and dyes and pigments as coloring agents of the image may be added to the printing plate material of the present invention. As the printing out agent, combinations of the compounds which release an acid upon heating by exposure (photo-acid releasing agents) and organic dyes which can form a salt with the acid may be illustrated as representative examples. Specifically, there may be illustrated a combination of o-naphthoquinonediazide-4-sufonic acid halogenide and a salt-forming organic dye described in Japanese Patent Laid-Open Nos. 36209/1975 and 8128/1978, and a combination of a trihalomethyl compound and a salt-forming organic dye described in Japanese Patent Laid-Open Nos. 36223/1978, 74728/1979, 3626/1985, 143748/1986, 151644/1986 and 58440/1988. As such trihalomethyl compounds, there are illustrated oxazole compounds and triazine compounds. Both compounds are excellent in stability with time, and provide a clear printing out image.

As the coloring agents of the image, other dyes than the aforesaid salt-forming organic dyes may be used. Oil-soluble dyes and basic dyes may be illustrated as preferred dyes including the salt-forming organic dyes.

Specifically, Oil Yellow #101, Oil Yellow #103, Oil Pink #312, Oil Green BG, Oil Blue BOS, Oil Blue #603, Oil Black BY, Oil Black BS, Oil Black T-505 (products of Orient Kagaku Kogyo Co., Ltd.) ,Victoria Pure Blue, Crystal Violet (CI 42555), Methyl Violet (CI 42535), Ethyl Violet, Rhodamine B (CI 145170B), Malachite Green (CI 42000) and Methylene Blue (CI 52015) are illustrated. In addition, dyes described in Japanese Patent Laid-Open No. 293247/1987 are particularly preferred.

These dyes may be added to the printing plate material in an amount of from 0.01 to 10% by weight, preferably from 0.1 to 3% by weight, based on the entire solid components of the printing plate material.

Moreover, plasticizers may be added to the printing plate material for improving flexibility of the coating film. For example, butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, oligomers or polymers of acrylic acid or methacrylic acid, etc. may be used.

The image recording material of the present invention is in general manufactured by dissolving the above-described components in a solvent and coating the solution on an appropriate support. Examples of the solvents to be used include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxyethane, methyl lactate, ethyl lactate, N,N-dimethylacetamide, N,N-dimethylformamide, tetramethylurea, N-methylpyrrolidone, dimethylsulfoxide, sulfolane, γ-butyrolactone and toluene, though not limitative at all.

These solvents may be used alone or in combination.

The concentration of the above components (entire solid components including the additives) in the solvent is preferably 1 to 50% by weight. The coating amount on the support obtained after drying (solid content) is varied depending upon the end-use, but is generally 0.5 to 5.0 $g/m^2$ as to the light-sensitive printing plate. Various coating methods may be employed as coating methods, and there may be illustrated, for example, bar coating, rotary coating, spray coating, curtain coating, dip coating, air knife coating, blade coating and roll coating. As the coating amount decreases, apparent sensitivity increases, but film characteristics of the light-sensitive film are deteriorated.

To the heat-sensitive layer of the present invention may be added a surfactant for improving coating properties, such as a fluorine-containing surfactant as described in Japanese Patent Laid-Open No. 170950/1987. Addition amount is preferably from 0.01 to 1% by weight, more preferably 0.05 to 0.5% by weight, based on the entire printing plate material.

Additionally, the heat-sensitive layer of the printing plate material of the present invention may have a two-layered structure. In this case, it is preferred to provide a first heat-sensitive layer containing a light-heat converter and an alkaline aqueous solution-soluble resin on a support, and provide thereon a second heat-sensitive layer of the above-described composition.

The support to be used in the present invention is a plate having dimensional stability and is exemplified by paper; paper laminated with plastics (e.g., polyethylene, polypropylene or polystyrene); metal plats (e.g., aluminum, zinc or copper); plastic films (e.g., cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate or polyvinyl acetal) and paper or plastic films laminated or deposited with metals as described above.

As the support of the present invention, polyester films or aluminum plates are preferred. Of these, aluminum plates showing a good dimensional stability and being comparatively inexpensive are particularly preferred. Preferred aluminum plates include pure aluminum plates and aluminum alloy plates containing aluminum as a major component and a slight amount of different elements. Further, plastic films laminated or deposited with aluminum may be used.

Foreign elements contained in the aluminum alloy include silicon, iron, manganese, copper, magnesium, chromium, zinc, bismuth, nickel and titanium. The content of the different elements in the alloy is 10% by weight or less. Pure aluminum is particularly preferred in the present invention, but 100% pure aluminum is difficult to obtain in the light of purifying techniques. Accordingly, a slight amount of different elements may be contained. Thus, the composition of the aluminum plate to be used in the present invention is not specified, and conventionally known and used aluminum plates may be properly utilized.

The thickness of the aluminum plate to be used in the present invention is from about 0.1 mm to about 0.6 mm, preferably from 0.15 mm to 0.4 mm, particularly preferably from 0.2 mm to 0.3 mm.

Prior to the surface roughening of the aluminum plate, degreasing is performed to remove the rolling oil on the surface of the plate using, for example, surfactants, organic solvents or alkaline aqueous solution, if required. Various methods are used for surface roughening treatment of the aluminum plate. For example, there are illustrated a mechanical roughening method, an electrochemical roughening method of electrochemically dissolving the surface to roughen, and a chemical roughening method of chemically dissolving the surface to roughen. As the mechanical methods, known mechanical methods such as a ball abrading method, a brushing method, a blasting method and an abrading method using buff may be used. As the electrochemical method, there is a method of performing alternating current or direct current electrolysis in a hydrochloric acid or nitric acid electrolytic solution. Further, as described in Japanese Patent Laid-Open No. 63902/1979, a method of a combination of mechanical roughening and electrochemical roughening may also be used. The thus surface roughened aluminum plate is subjected, if necessary, to anodic oxidation treatment for increasing water retentive properties and abrasion resistance of the surface, as needed, after being subjected to alkali etching treatment and neutralizing treatment.

As the electrolytes to be used for the anodic oxidation treatment of the aluminum plate, various electrolytes capable of forming aporous oxide film maybe used. In general, sulfuric acid, phosphoric acid, oxalic acid, chromic acid or mixed acid of these is used. The concentration of the electrolyte is determined arbitrarily depending upon the kind of the electrolyte.

Treatment conditions of the anodic oxidation cannot be determined in a general manner as the conditions fluctuate variously depending upon the electrolytic solution to be used, but generally appropriately the concentration of the electrolyte is from 1 to 80% by weight, temperature of the solution is from 5 to 70° C., electric current density is from 5 to 60 A/dm$^2$, voltage is from 1 to 100 V, and electrolytic time is from 10 seconds to 5 minutes.

In case where the amount of anodic oxidation coating is less than 1.0 g/m$^2$, there results an insufficient press life and the non-image areas of the lithographic printing plate is liable to be scratched and, as a result, "scratch stain", i.e., adhesion of ink at that scratch, is liable to occur. After anodic oxidation treatment, the aluminum surface is subjected to hydrophilization treatment, if necessary.

As the hydrophilization treatment to be employed in the present invention, there is a method of treatment with alkali metal silicate (e.g., an aqueous solution of sodium silicate) as disclosed in U.S. Pat. Nos. 2,714,066, 3,181,461, 3,280,734 and 3,902,734. In this method, the support is immersed and treated in a sodium silicate aqueous solution or electrolytically treated. As other methods, there are a method of treating with potassium zirconium acid fluoride as described in Japanese Patent Publication No. 22063/61, and a method of treating with polyvinylsulfonic acid as disclosed in U.S. Pat. Nos. 3,276,868, 4,153,461 and 4,689,272.

(Other Layers)

The original lithographic printing plate comprises a support having provided thereon a heat-sensitive layer and, as the aforesaid other layer, an undercoating layer may be provided therebetween. As components for forming the undercoating layer, there are illustrated various organic compounds. For example, there are illustrated carboxymethyl cellulose, dextrin, gum arabic, amino group-having phosphonic acids such as 2-aminoethylphosphonic acid, organic phosphonic acids such as optionally substituted phenylphosphonic acids, naphthylphosphonic acid, alkylphosphonic acid, glycerophosphonic acid, emthylenediphosphonic acid and ethylenediphosphonic acid, organophosphoric acids such as optionally substituted phenylphosphoric acids, naphthylphosphoric acid, alkylphosphoric acid and glycerophosphoric acid, organophosphinic acids such as optionally substituted phenylphosphinic acids, naphthylphosphinic acid, alkylphosphinic acid and glycerophosphinic acid, amino acids such as glycine and β-alanine, and hydroxyl group-having amine hydrochlorides such as triethanolamine hydrochloride. These may be used alone or in combination of two or more.

The undercoating layer may be formed by the following methods. That is, a solution of the aforesaid organic compound in water or an organic solvent such as methanol, ethanol or methyl ethyl ketone, or a mixed solvent thereof is coated on an aluminum plate, followed by drying.

Alternatively, an aluminum plate is immersed in the solution of the organic compound in water or an organic solvent such as methanol, ethanol, methyl ethyl ketone, or a mixed solvent thereof to thereby adsorb the compound on the aluminum plate, followed by washing with water and drying to form the undercoating layer.

The former method permits to coat a solution of the organic compound of 0.005 to 10% by weight in concentration through various coating methods. In the latter method, concentration of the solution ranges from 0.01 to 20% by weight, preferably from 0.05 to 5% by weight, immersing temperature is from 20 to 90° C., preferably from 25 to 50° C., and immersing time is from 0.1 second to 20 minutes, preferably from 2 seconds to 1 minute. PH of the solution to be used here may be adjusted to the range of from pH 1 to 12 using a basic substance such as ammonia, triethylamine or potassium hydroxide or an acidic substance such as hydrochloric acid or phosphoric acid. In addition, a yellow dye may be added thereto in order to improve tone reproducibility of the lithographic printing plate. The amount of the undercoating layer is preferably from 2 to 200 $mg/m^2$, more preferably from 5 to 100 $mg/m^2$. In case where the coating amount is less than 2 $mg/m^2$, there might result an insufficient press life. The same applies in case where the coating amount is more than 200 $mg/m^2$.

[Imagewise Exposure]

The original lithographic printing plate is generally subjected to imagewise exposure and development processing. Light sources emitting active rays to be used in the imagewise exposure include a mercury lamp, a metal halide lamp, a xenon lamp, a chemical lamp and a carbon arc lamp. Radiation includes electron beams, X-rays, ion beams and far infrared rays. In addition, g-rays, i-rays, deep-UV rays and high density energy beam (laser beam) may also be used. The laser beam includes helium.neon laser, argon laser, cripton laser, helium.cadmium laser and KrF excimer laser. Of these, light sources emitting a light in the range of from near infrared region to infrared region, with solid state laser and semiconductor laser being particularly preferred.

[Development Processing]

As a developing solution and a replenisher to be used in the development processing, alkali aqueous solutions having so far been known may be used. For example, there are illustrated inorganic alkali salts such as sodium silicate, potassium silicate, tertiary sodium phosphate, tertiary potassium phosphate, tertiary ammonium phosphate, secondary sodium phosphate, secondary potassium phosphate, secondary ammonium phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, ammonium hydroxide, potassium hydroxide and lithium hydroxide. Further, organic alkali agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethyleneimine, ethylenediamine and pyridine are illustrated. These alkali agents may be used alone or in combination of two or more. Of these alkali agents, a particularly preferred developing solution is an aqueous solution of a silicate such as sodium silicate or potassium silicate for the reason that the solution enables to adjust developing properties by selecting the ratio of silicon oxide $SiO_2$, the component of silicate, to alkali metal oxide $M_2O$ and the concentrations. For example, alkali metal silicates as described in Japanese Patent Laid-Open No. 62004/1979 and Japanese Patent Publication No. 7427/1982 are effectively used.

It is known that, when development is conducted by using an automatic processor, a vast volume of PS plates can be processed without replacing the developing solution in a developing tank for a long period of time, by the addition of an aqueous solution (replenisher) having a higher alkalinity than that of the developing solution to the developing solution. To the developing solution and the replenisher may be added various surfactants and organic solvents according to necessity for the purpose of accelerating or controlling development, dispersing developer scum and increasing the affinity of the image areas of a printing plate to ink. As preferred surfactants, there are illustrated anionic, cationic, nonionic, and amphoteric surfactants. To the developing solution and the replenisher may further be added, if necessary, reducing agents such as hydroquinone, resorcin, sodium salts and potassium salts of inorganic acid such as sulfurous acid, sulfurous acid hydroacid and, further, organiccarboxylic acids, defoaming agents, and water softeners. The printing plate having been development processed with the above-described developing solution and the replelnisher is post-treated with a washing water, a rinsing water containing surfactants and a desensitizing solution containing gum arabic or starch derivatives. As the post-treatment of the original lithographic printing plate, these treatments may be combined with each other in various manners.

In recent years, automatic processors for printing plates have come into wide use in the plate-making and printing field in order to standardize and rationalize plate-making works. The automatic processor generally comprises a developing part and a post-treating part, and is constituted by a printing plate-conveying device, tanks for solutions of respective treatments, and a spraying device. In the processor, an exposed printing plate is horizontally conveyed, during which respective treating solutions pumped up are blown against the plate through a spray nozzle to conduct development processing. Recently, it is also known to convey the printing plate in a state of being dipped in a treating solution fully charged in a tank by means of guide rolls. In such automatic processing, the processing can be conducted with replenishing respective treating solutions with replenishers depending upon the amount of treated printing plates and operation time. In addition, a so-called disposal processing system is also applicable wherein the treatment is conducted using a substantially non-used processing solutions.

In case where an unnecessary image area is present (e.g., the film edge trace of the original film) on the lithographic printing plate obtained by imagewise exposure, development, washing with water and/or rinsing and/or gumming, this unnecessary image area is erased. For this erasure, a method of coating an erasing solution on the unnecessary image area, allowing to stand for a predetermined time, and then washing with water as described in Japanese Patent Publication No. 13293/1990 is preferred, but a method of irradiating the unnecessary image area with an actinic ray introduced by an optical fiber and then performing development as described in Japanese Patent Laid-Open No. 174842/1984 is also utilized.

The thus-obtained lithographic printing plate can be offered to printing process after being coated, if necessary, with a desensitizing gum but, when a lithographic printing plate having a higher press life is desired, the plate is subjected to burning treatment.

In the case of burning the lithographic printing plate, it is preferred to treat the plate, prior to burning, with a surface adjusting solution as described in Japanese Patent Publication Nos. 2518/1986 and 28062/1980, Japanese Patent Laid-Open Nos. 31859/1987 and 159655/1986. For that treatment, a method of coating a surface adjusting solution on the lithographic printing plate using sponge or absorbent cotton impregnated with the surface adjusting solution, or a method of coating by immersing the lithographic printing plate in a vat filled with a surface adjusting solution, or a method of coating by an automatic coater can be applied. Making the coating amount uniform by means of squeegee or squeegee rollers after coating provides more preferred results.

The coating amount of a surface adjusting solution is, in general, suitably from 0.03 to 0.8 $g/m^2$ (by dry weight). The lithographic printing plate coated with a surface adjusting solution is heated at high temperature, if necessary after drying, using a burning processor (e.g., Burning Processor BP-1300, commercially available from Fuji Photo Film Co., Ltd.). The heating temperature and time depend upon the kinds of components forming the image but are preferably from 180 to 300° C. and from 1 to 20 minutes.

The burning-treated lithographic printing plate can be properly subjected to conventional treatments as needed, such as washing with water and gumming but, when a surface adjusting solution containing water-soluble high molecular compounds is used, so-called desensitizing treatment such as gumming can be omitted. A lithographic printing plate obtained through these processes is loaded on an offset printing machine and used for printing a lot of sheets.

EXAMPLE

The present invention is described in more detail by reference to examples, but the present invention is not construed as being limited thereto.

[Preparation of Fluorine-containing Polymer A1]

30 parts by weight of a fluorine-containing monomer represented by the foregoing A-31, 20 parts by weight of methyl methacrylate, 10parts by weight of hydroxyethyl methacrylate, 15 parts by weight of i-butyl methacrylate and 150 parts by weight of methyl isobutyl ketone were charged in a glass flask equipped with a stirrer, a condenser and a thermometer, then 0.4 part by weight of azobisisobutyronitrile as a polymerization initiator and 0.3 part by weight of laurylmercaptan as a chain transfer agent were added thereto while introducing a nitrogen gas under reflux, followed by refluxing for 7 hours to complete polymerization, thus fluorine-containing polymer A1 being synthesized. This polymer had a molecular weight in terms of polystyrene measured by gel permeation chromatography (GPC) of Mn=10000.

[Preparation of Fluorine-containing Polymer A2]

Fluorine-containing polymer A2 was synthesized in the same procedures as described with respect to preparation of the fluorine-containing polymer Al except for changing i-butyl methacrylate to the compound represented by the foregoing formula B-4.

Preparation of Fluorine-containing Polymer B1]

46.6 g of 2-(perfluorooctyl)ethyl acrylate, 28.8 g of N-(4-sulfamoylphenyl)methacrylamide, 18.9 g of (n)-nonyl methacrylate and 180 g of dimethylacetamide were placed in a 500 ml, three-necked flask, and the mixture was kept at 65° C. while stirring under nitrogen stream. 3.73 g of 2,2'-azobis (2,4-dimethylvalelonitrile) was added thereto, and stirring was continued. After 4 hours, the temperature of the mixture increased to 68° C., followed by keeping the temperature at the level for 1 hour. After completion of the reaction, the reaction mixture was cooled to room temperature, and the reaction solution was poured into 400 ml of water. A precipitated solid was collected by filtration, and dried. Yield: 32.5 g. The product had a weight average molecular weight of 23,000 measured by GPC.

[Preparation of Fluorine-containing Polymers B2 and B3]

Polymers shown in the following table were prepared in the same manner as with the fluorine-containing polymer B1.

TABLE 1

| Product | Name of Polymer | Weight Average Molecular Weight |
|---|---|---|
| Fluorine-containing polymer B1 | P-6 | 23,000 |
| Fluorine-containing polymer B2 | P-2 | 18,000 |
| Fluorine-containing polymer B3 | P-5 | 15,000 |

[Preparation of Alkali-soluble High Molecular Compound A]

31.0 g (0.36 mol) of methacrylic acid, 39.1 g (0.36 mol) of ethyl chloroformate and 200 ml of acetonitrile were charged in a 500 ml, three-necked flask equipped with a stirrer, a cooling tube and a dropping funnel, and the mixture was stirred while cooling in a nice-water bath. 36.4 g(0.36 mol)of triethylamine was dropwise added thereto over about 1 hour through the dropping funnel. After completion of the dropwise addition, the ice-water bath was removed, and the mixture was stirred for 30 minutes at room temperature.

To this mixture was added 51.7 g (0.30 mol) of p-aminobenzenesulfonamide, and the mixture was stirred for 1 hour while heating to 70° C. in an oil bath. After completion of the reaction, this mixture was poured into 1 liter of water under stirring, followed by stirring the resulting mixture for 30 minutes. This mixture was filtered to take out a precipitate. After adding thereto 500 ml of water to obtain a slurry, this slurry was filtered, and the obtained solid was dried to obtain white solid of N-(p-aminosulfonylphenyl)methacrylamide (yield: 46.9 g).

Next, 5.04 g (0.0210 mol) of N-(p-aminosulfonylphenyl) methacrylamide, 2.05 g (0.0180 mol) of ethyl methacrylate, 1.11 g (0.021 mol) of acrylonitrile and 20 g of N,N-dimethylacetamide were placed in a 100 ml, three-necked flask equipped with a stirrer, a cooling tube and a dropping funnel, and the mixture was stirred while heating to 65 C. in a hot water bath. To this mixture was added 0.15 g of "V-65" (made by Wako Jun-yaku K. K.), and the resulting mixture was stirred for 2 hours under nitrogen stream while keeping the temperature at 65° C. To this reaction mixture was further dropwise added a mixture of 5.04 g of N-(p-aminosulfonylphenyl)methacrylamide, 2.05 g of ethyl methacrylate, 1.11 g of acrylonitrile, 20 g of N,N-dimethylacetamide and 0.15 g of "V-65" through a dropping funnel over 2 hours. After completion of the dropwise addition, the resultant mixture was further stirred for 2 hours at 65° C. After completion of the reaction, 40 g of methanol was added to the mixture, and the resultant mixture was cooled, followed by throwing the mixture into 2 liters of water under stirring the water and, after stirring for 30 minutes, the precipitate was collected by filtration and dried to obtain 15 g of a white solid.

Weight average molecular weight of the polymer was measured to be 53,000. Weight average molecular weight (Mw) was measured according to gel permeation chromatography (in terms of polystyrene).

[Preparation of a Substrate]

A 0.3-mm thick aluminum plate (quality of the material: 1050) was washed with trichloroethylene to degrease, then the surface of the plate was grained using a nylon brush and a 400-mesh pumice suspension in water, and well washed with water. This plate was immersed for 9 seconds in a 45° C., 25% sodium hydroxide aqueous solution to conduct etching. After washing with water, the plate was further immersed for 20 seconds in a 20% nitric acid, followed by washing with water. The etching amount of the grained surface was about 3 g/$m^2$. Then, this plate was subjected to electrolysis using a 7% sulfuric acid as an electrolyte solution at a current density of 15 A/$dm^2$ to form a 3 g/m2 direct current anode oxidation film, followed by washing with water and drying. Further, the plate was treated in a 2.5% by weight sodium silicate aqueous solution at 30° C. for 10 seconds, and the following coating solution was coated thereon, followed by drying the coating film at 80° C. for 15 seconds to obtain a substrate. The amount of coated film after drying was 15 mg/$m^2$.

| Undercoating solution: | |
|---|---|
| The following compound | 0.3 g |
| Methanol | 100 g |
| Water | 1 g |

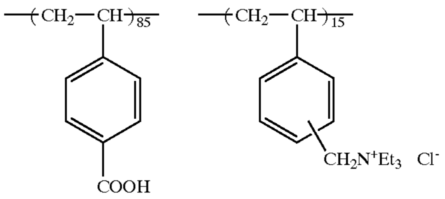

Molecular Weight: 28,000

Example 1

The following light-sensitive solution 1 was coated on the thus-obtained substrate in a coating amount of 1.0 g/$m^2$ after drying, then dried by means of PERFECT OVEN PH2000 made by TABAI K.K. at 140° C. for 50 seconds with setting Wind Control at 7 to obtain lithographic printing plate 1.

| Light-sensitive solution 1: | |
|---|---|
| m,p-Cresol novolak (m/p ratio = 6/4; weight average molecular weight: 5,000) | 0.474 g |
| Alkali-soluble high molecular compound A | 2.37 g |
| Cyanine dye A (following structure) | 0.155 g |
| 2-Methoxy-4-(N-phenylamino)benzene-diazonium.hexafluorophosphate | 0.03 g |
| Tetrahydrophthalic anhydride | 0.19 g |
| Ethyl Violet (counter ion: 6-hydroxy-β-naphthalenesulfonic acid) | 0.11 g |
| Fluorine-containing polymer A1 | 0.04 g |
| Fluorine-containing polymer B1 | 0.02 g |
| p-Toluenesulfonic acid | 0.008 g |
| Bis-p-hydroxyphenylsulfone | 0.13 g |
| n-Dodecyl stearate | 0.06 g |
| γ-Butyrolactone | 13 g |
| Methyl ethyl ketone | 24 g |

-continued

| | |
|---|---|
| 1-Methoxy-2-propanol | 11 g |

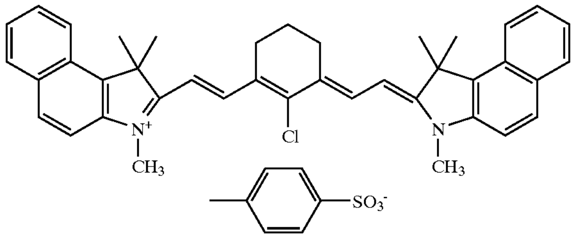

cyanine dye A

Example 2

Lithographic printing plate 2 was obtained in the same manner as in Example 1 except for changing the fluorine-containing polymer A1 used in the light-sensitive solution 1 in Example 1 to fluorine-containing polymer A2.

Example 3

Lithographic printing plate 3 was obtained in the same manner as in Example 1 except for changing the fluorine-containing polymer A1 and the fluorine-containing polymer B1 used in the light-sensitive solution 1 in Example 1 to fluorine-containing polymer A2 and fluorine-containing polymer B2, respectively.

Example 4

Lithographic printing plate 4 was obtained in the same manner as in Example 1 except for changing the fluorine-containing polymer A1 and the fluorine-containing polymer B1 used in the light-sensitive solution 1 in Example 1 to fluorine-containing polymer A2 and fluorine-containing polymer B3, respectively.

Comparative Example 1

Comparative printing plate 1 was obtained in the same manner as in Example 1 except for not adding the fluorine-containing polymer A1 used in the light-sensitive solution in Example 1.

Comparative Example 2

Comparative printing plate 2 was obtained in the same manner as in Example 1 except for changing the fluorine-containing polymer A1 used in the light-sensitive solution in Example 1 to fluorine-containing polymer A2 and not adding the fluorine-containing polymer B1.

Comparative Example 3

Comparative printing plate 3 was obtained in the same manner as in Example 1 except for changing the fluorine-containing polymer B1 used in the light-sensitive solution in Example 1 to Megafac F177 (made by Dai-Nippon Ink & Chemical, Inc.).

Example 5

The following light-sensitive solution (2) was coated on a substrate in a dry amount of 0.85 g/$m^2$, then dried at 140° C. for 50 seconds in PERFECT OVEN PH200 made by TABAI K.K. with setting Wind Control at 7. Subsequently, light-sensitive solution (3) was coated thereon in a dry amount of 0.15 g/$m^2$, then dried at 120° C. for 60 seconds in PERFECT OVEN PH200 made by TABAI K.K. with setting Wind Control at 7 to obtain lithographic printing plate 5.

| Formulation of light-sensitive solution (2): | |
|---|---|
| m,p-Cresol novolak (m/p ratio = 6/4; weight average molecular weight: 5,000) | 0.237 g |
| Alkali-soluble high molecular compound A | 2.37 g |
| Cyanine dye A (foregoing structure) | 0.10 g |
| 2-Methoxy-4-(N-phenylamino)benzene-diazonium.hexafluorophosphate | 0.01 g |
| Tetrahydrophthalic anhydride | 0.19 g |
| Ethyl Violet (counter ion: 6-hydroxy-β-naphthalenesulfonic acid) | 0.11 g |
| Fluorine-containing polymer B1 | 0.04 g |
| Fluorine-containing polymer A2 | 0.02 g |
| p-Toluenesulfonic acid | 0.008 g |
| Bis-p-hydroxyphenylsulfone | 0.10 g |
| γ-Butyrolactone | 13 g |
| Methyl ethyl ketone | 24 g |
| 1-Methoxy-2-propanol | 11 g |

| Formulation of light-sensitive solution (3): | |
|---|---|
| m,p-Cresol novolak (m/p ratio = 6/4; weight average molecular weight: 5,000) | 0.237 g |
| Cyanine dye A (foregoing structure) | 0.025 g |
| 2-Methoxy-4-(N-phenylamino)benzene-diazonium.hexafluorophosphate | 0.01 g |
| Fluorine-containing polymer B1 | 0.04 g |
| Fluorine-containing polymer A2 | 0.02 g |
| Bis-p-hydroxyphenylsulfone | 0.003 g |
| Dodecyl stearate | 0.03 g |
| Methyl ethyl ketone | 15 g |
| 1-Methoxy-2-propanol | 8 g |

Comparative Example 4

Comparative printing plate 4 was obtained in the same procedures as in Example 5 except for changing the fluorine-containing polymers A and B used in the light-sensitive solutions 2 and 3 of Example 5 to Megafac F177 (made by Dai-Nippon Ink & Chemical, Inc.).

[Evaluation of Surface State]

The dried original lithographic printing plates were viewed, and uniformly coated plates were rated as O, and plates suffering unevenness upon coating and drying as X.

[Evaluation of Development Latitude]

Each of the resultant lithographic printing plates was subjected to IR laser writing of a test pattern with a beam strength of 9 W and a drum rotation speed of 150 rpm. Subsequently, a developing solution, DT-1 (diluted with water in a ratio of 1:8), made by Fuji Photo Film Co., Ltd. was charged in a PS processor 900H manufactured by Fuji Photo Film Co., Ltd., and development was conducted at a solution temperature of 30° C. for a developing time of 12 seconds. Additionally, as a gum solution, FP-2W (diluted with water in a ratio of 1:1) was used. Under the developing conditions, every lithographic printing plate showed good developability in exposed areas. Then, on the assumption that the developing solution becomes condensed, the degree of dilution with city water of the developing solution was changed to (1:6.5), and the exposed lithographic printing plates were similarly developed at a solution temperature of 30° C. for a developing time of 12 seconds.

A reduction in optical density of non-exposed areas of the light-sensitive layer of the thus-developed lithographic printing plate was visually evaluated. Samples showing reduction in density were rated as X, and samples showing no reduction in density were rated as O.

[Evaluation of Scratch Resistance]

Each of the obtained lithographic printing plates was abraded 50 times using a rotary abrasion tester (made by TOYO SEIKI K.K.) by applying abraser felt CS5 under a load of 250 g. Then, a developing solution, DT-1 (diluted with water in a ratio of 1:8), made by Fuji Photo Film Co., Ltd. was charged in a PS processor 900H manufactured by Fuji Photo Film Co., Ltd., and development was conducted at a solution temperature of 30° C. for a developing time of 12 seconds. Additionally, as a gum solution, FP-2W (diluted with water in a ratio of 1:1) was used.

The resultant lithographic printing plates were viewed, and samples showing no more change in optical density of the light-sensitive film in abraded areas in comparison with non-abraded areas were rated as O, samples showing a serious reduction in optical density of the light-sensitive film in abraded areas were rated as X, and samples showing an intermediate level of reduction were rated as Δ.

[Evaluation of Stability with Time]

Assuming serious storing conditions, the resultant lithographic printing plates were stored for 2 weeks in contact with interleaving paper under the conditions of 35° C. in room temperature and 85% in relative humidity. Thereafter, the above-described evaluation of scratch resistance was conducted. Samples showing no more change in optical density of the light-sensitive film in abraded areas in comparison with non-abraded areas were rated as O, and samples showing a serious reduction in optical density of the light-sensitive film in abraded areas were rated as X.

Results are shown in Table 2.

TABLE 2

| | Surface State | Development Latitude | Scratch Resistance | Stability with Time |
|---|---|---|---|---|
| Example 1 | ○ | ○ | ○ | ○ |
| Example 2 | ○ | ○ | ○ | ○ |
| Example 3 | ○ | ○ | ○ | ○ |
| Example 4 | ○ | ○ | ○ | ○ |
| Example 5 | ○ | ○ | ○ | ○ |
| Com. Ex. 1 | ○ | X | ○ | X |
| Com. Ex. 2 | X | — | — | — |
| Com. Ex. 3 | ○ | ○ | X | X |
| Com. Ex. 4 | ○ | X | ○ | X |

As is apparent from Table 2, by adding specific two fluorine-containing polymers of the present invention, there were obtained lithographic printing plates (adapted) for infrared laser which showed a good coated surface state, an excellent stability with time against scratch, an excellent resistance against scratch and an excellent development latitude.

Additionally, it is seen that even when the heat-sensitive layer has a double-layer structure, the lithographic printing plate of the present invention adapted for infrared laser provides excellent effects.

Thus, the present invention provides a lithographic printing plate (adapted) for infrared laser which shows an excellent coated surface state and excellent stability with time against scratch.

The entitle disclosure of each and every foreign patent application from which the benefit of foreign priority has been claimed in the present application is incorporated herein by reference, as if fully set forth herein.

While the present invention has been described in detail and with reference to specific examples thereof, it will be apparent to one skilled in the art that various changes and modifications can be made therein without departing from the spirit and scope thereof.

What is claimed is:

1. A lithographic printing plate for infrared laser, comprising a support and a heat-sensitive layer containing the following (A) to (D):

(A) a substance which absorbs a light to generate heat;

(B) an alkaline aqueous solution-soluble resin having a phenolic hydroxyl group;

(C) a polymer containing a (meth)acrylate monomer having 2 or 3 perfiuoroalkyl groups containing 3 to 20 carbon atoms within the molecule as a polymer component; and (D) a fluorine-containing polymer containing as copolymer components at least the following components 1), 2) and 3):

1) an addition polymerizable, fluorine-containing monomer having in the side chain a fluoro aliphatic group wherein hydrogen atoms on the carbon atoms are replaced by fluorine atoms;

2) a monomer selected from the group consisting of monomers having a structure represented by the following formulas [1], [2], [3] and [4];

$CH_2{=}CA^1[CO{-}W{-}R^2]$ [1]

$CH_2{=}CA^1[O{-}CO{-}R^3]$ [2]

$CH_2{=}CA^1[U]$ [3]

[4]

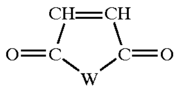

wherein $A^1$ represents a hydrogen atom, a halogen atom or an alkyl group, W represents oxygen or $-NR^1-$, $R^1$ represents a hydrogen atom, an alkyl group or an aryl group, $R^2$ represents an optionally substituted alkyl group or an optionally substituted aryl aroup; $R^3$ represents an alkyl group or an aryl group, and U represents a cyano group, an aryl group, an alkoxy group, an aryloxy group, an acyloxymethyl group, a nitrogen-containing hetero ring or $-CH_2OCOR^3$; and 3) a monomer having an acidic hydrogen atom and having an acidic group wherein the acidic hydrogen atom is bound to a nitrogen atom.

2. The lithographic printing plate for infrared laser as claimed in claim 1, wherein the polymer (C) is a copolymer comprising a (meth)acrylate monomer having 2 or 3 perfluoroalkyl groups containing 3 to 20 carbon atoms and a hydroxyl group-containing (meth)acrylate monomer.

3. The lithographic printing plate for infrared laser as claimed in claim 1, which further contains a copolymer containing, as a copolymerizable component, (E) at least one of the following 4) to 6) in a content of 10 mol % or more:

4) a monomer having within the molecule a sulfonamido group wherein at least one hydrogen atom is bound to the nitrogen atom;

5) a monomer having within the molecule an active imino group represented by the following formula:

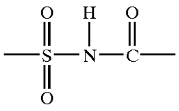

6) acrylamide, methacrylamide, acrylic ester, methacrylic ester or hydroxystyrene, each having a phenolic hydroxyl group.

4. The lithographic printing plate for infrared laser as claimed in claim 1, further comprising, between said support and said heat-sensitive layer, a second heat-sensitive layer containing (A) a substance which absorbs a light to generate heat and (B) an alkaline aqueous solution-soluble resin.

* * * * *